(12) United States Patent
Kawasaki et al.

(10) Patent No.: US 7,031,422 B2
(45) Date of Patent: Apr. 18, 2006

(54) SHIFT REGISTER, DISPLAY APPARATUS AND INFORMATION DISPLAY APPARATUS

(76) Inventors: Somei Kawasaki, Canon Kabushiki Kaisha, 3-30-2, Shimomaruko, Ohta-ku, Tokyo (JP); Masami Iseki, Canon Kabushiki Kaisha, 3-30-2, Shimomaruko, Ohta-ku, Tokyo (JP)

( * ) Notice: Subject to any disclaimer, the term of this patent is extended or adjusted under 35 U.S.C. 154(b) by 0 days.

(21) Appl. No.: 11/051,187

(22) Filed: Feb. 7, 2005

(65) Prior Publication Data

US 2005/0141665 A1    Jun. 30, 2005

Related U.S. Application Data

(62) Division of application No. 10/650,731, filed on Aug. 29, 2003, now Pat. No. 6,914,956.

(30) Foreign Application Priority Data

Sep. 2, 2002 (JP) ............................. 2002-256401
Aug. 28, 2003 (JP) ............................. 2003-305080

(51) Int. Cl.
*G11C 19/00* (2006.01)

(52) U.S. Cl. ..................... 377/68; 345/99; 345/100

(58) Field of Classification Search .................. 377/68; 345/99, 100

See application file for complete search history.

(56) References Cited

U.S. PATENT DOCUMENTS

| 5,481,749 A | 1/1996 | Grondalski ............... 712/16 |
| 6,373,454 B1 | 4/2002 | Knapp et al. ............. 345/76 |
| 6,737,813 B1 | 5/2004 | Kawasaki et al. ....... 315/169.3 |
| 6,812,768 B1 | 11/2004 | Kawasaki et al. ......... 327/333 |

FOREIGN PATENT DOCUMENTS

JP         10-74060        3/1998

*Primary Examiner*—Margaret R. Wambach

(57) ABSTRACT

A shift register includes a plurality of pulse generation portions for generating a series of pulse signals in response to a level change of inputted clock signals, and a plurality of shift pulse generation units. The plurality of shift pulse generation units has a predetermined shift pulse generation unit, with the predetermined shift pulse generation unit having a status signal generation circuit for outputting a first status signal to common wiring to which both of an earlier shift pulse generation unit and a later shift pulse generation unit are connected, and a clock supply circuit for supplying a clock signal to the pulse generation portion which belongs to the predetermined shift pulse generation unit. In addition, there is a first period in which the clock supply circuit supplies the clock signal to the pulse generation portion which belongs to the predetermined shift pulse generation unit and a second period in which the clock signal is not supplied. During the first period in which the clock signal is supplied, a status signal is inputted from the earlier shift pulse generation unit, and a status signal is not inputted from the later shift pulse generation unit.

11 Claims, 22 Drawing Sheets

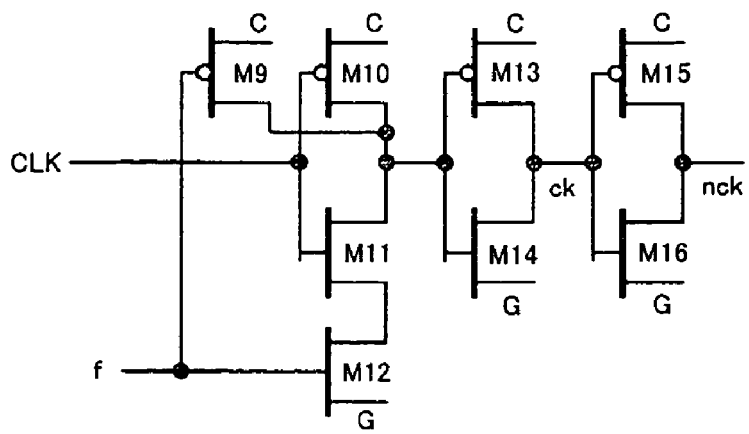
*Fig. 7A*
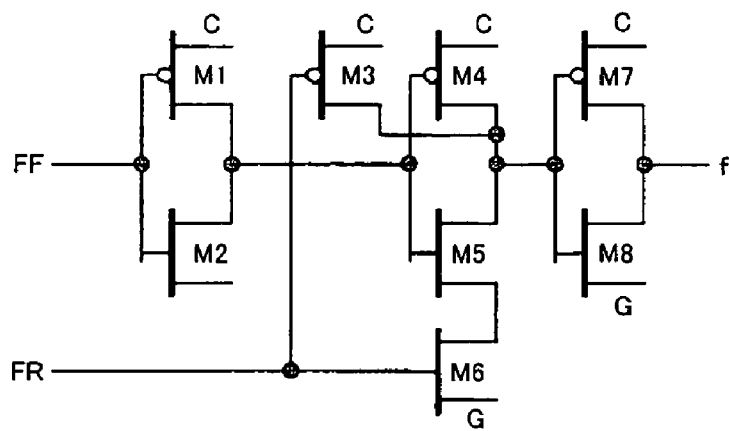
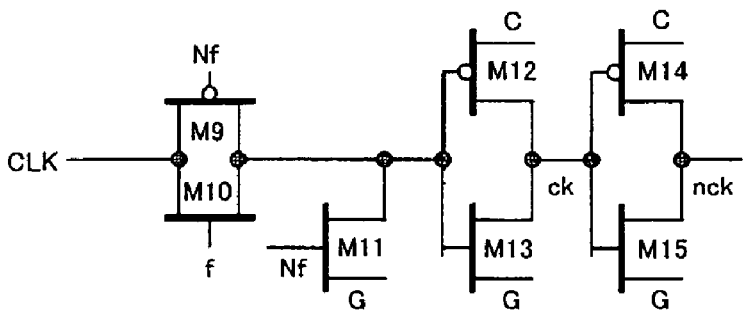
*Fig. 7B*
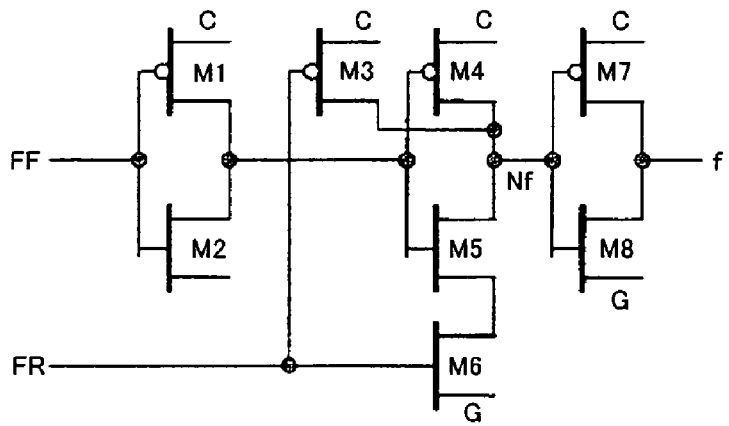

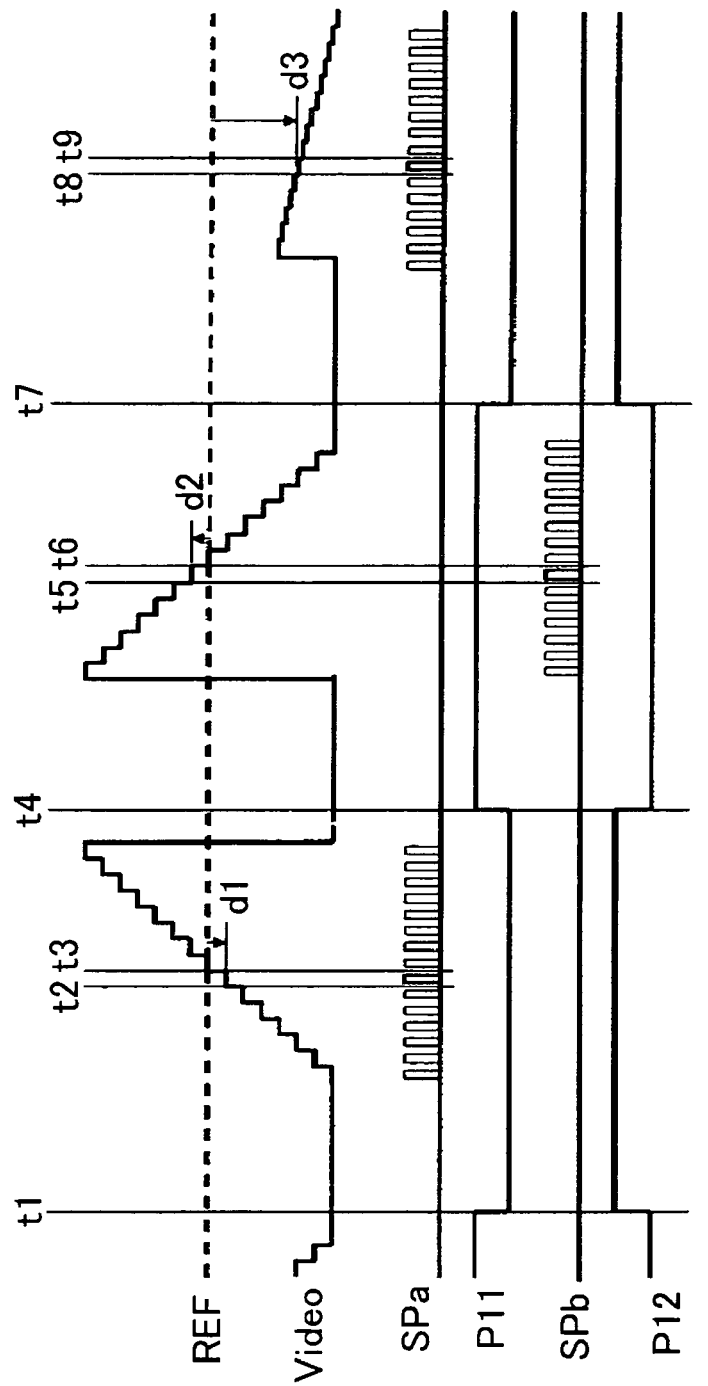

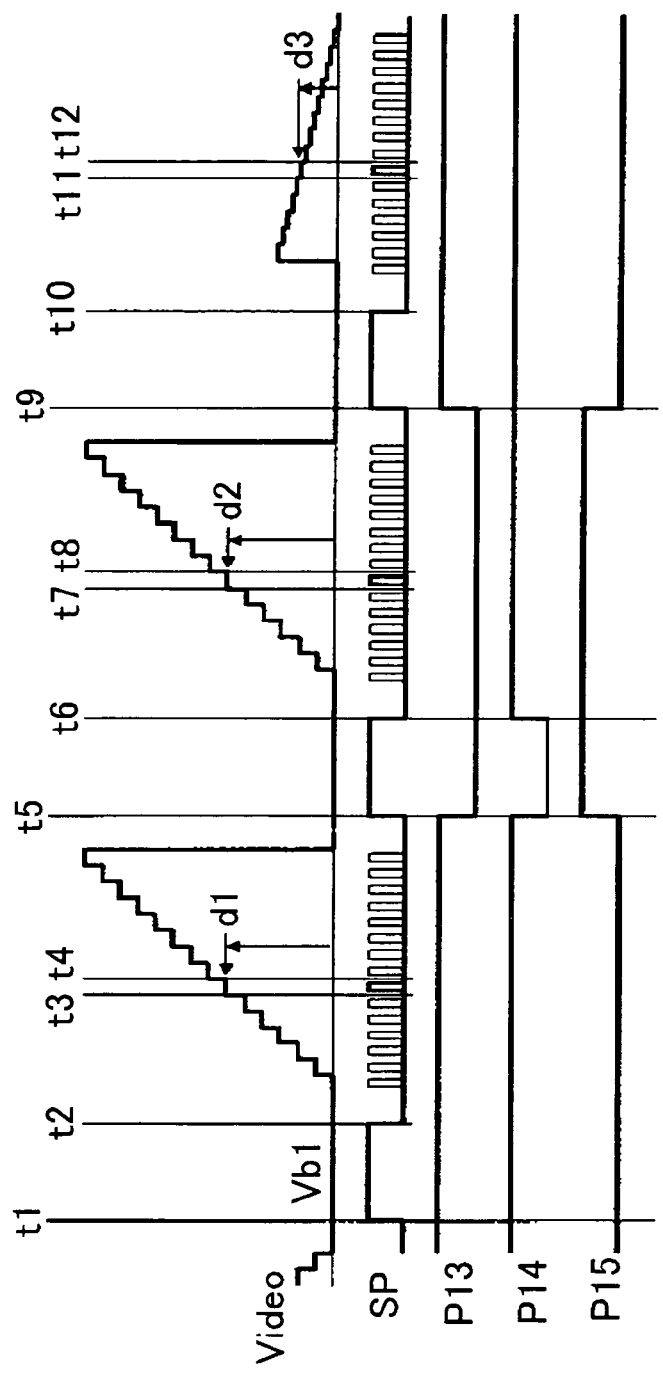

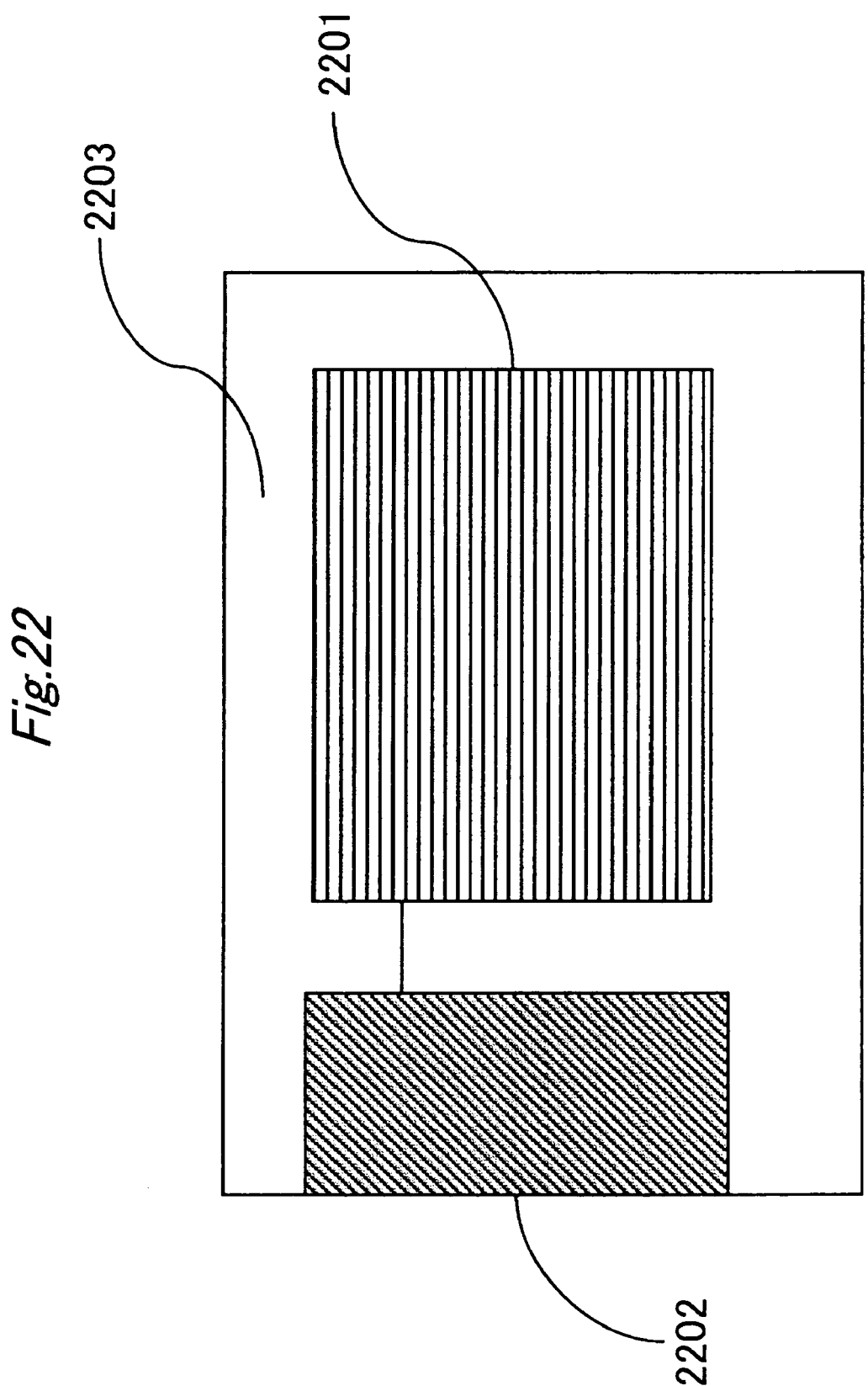

SHIFT REGISTER, DISPLAY APPARATUS AND INFORMATION DISPLAY APPARATUS

This is a divisional of application Ser. No. 10/650,731, filed on Aug. 29, 2003, now U.S. Pat. No. 6,914,956 which is now allowed.

BACKGROUND OF THE INVENTION

1. Field of the Invention

This invention relates to a shift register which is useful for a system such as a display panel etc. which requires power saving including a shift register.

2. Description of the Related Art

In an image display apparatus which was configured such that pixels with light emitting devices etc. are arranged in a two-dimensional manner, in order to generate sampling pulses for taking in input serial data (information), for example, a shift register as shown in FIG. 8 is used. This is of such a simple structure that a scanning start signal SSP and a clock signal CK are inputted, and N pieces of registers (D type flip flop (hereinafter, abbreviated as DFF)), and the clock signal CK is inputted to all clock inputs of each DFF, and a Q output of each DFF is connected to a D input of a next stage DFF, and N pieces of sampling pulses SP(1) to SP(N) from a Q output of each DFF.

FIG. 9 is a time chart showing operations of a shift register of FIG. 8. When it is arranged that H level of the scanning start signal SSP simply includes a first ↑ timing of the clock signal CK, it is possible to generate a first sampling pulse SP(1) between the first ↑ timing and a second ↑ timing of the clock signal CK. And, by the clock signal CK which is inputted sequentially, sampling pulses of SP(2) and upward are generated, and a last sampling pulse SP(N) is generated between a Nth ↑ timing and (N+1)th ↑ timing of the clock signal CK. Therefore, (N+1) pieces of ↑ timings of the clock signal CK are required so as to generate N pieces of sampling pulses.

FIG. 10 indicates a circuit structure of DFF which is used. DFF is configured by a clock buffer, a master latch and a slave latch.

The clock buffer comprises two inverters in which input clock Kin is made as a positive clock ck and a negative clock nck, and in FIG. 10, it is configured by M1 to M4.

The master latch is configured by two switches which are configured by M5/M6 and M7/M8 and two inverters which are configured by M9/M10 and M11/M12. The slave switch is configured by two switches which are configured by M13/M14 and M15/M16 and two inverters which are configured by M17/M18 and M19/M20. And an inverter which is configured by M23/M24 is one for outputting a positive output Q.

Further, in all drawings, C and G which are described mainly at a drain terminal of a transistor which configures an inverter designate power supply VCC and a GND terminal, respectively.

<Power Consumption of Shift Register>

Power consumption of DFF in FIG. 10 will be described. Power consumption of a MOS circuit is generated by charging and discharging capacity which is added to a node of a push-pull circuit which is represented by an inverter and which comprises P type transistors and N type transistors. Capacity of the MOS circuit is mainly caused by channel capacity Cox which is generated between a gate oxide film and a channel. Here, simply, a switch circuit in which a gate is of low impedance (push-pull output) and an inverter circuit have the same load capacity Co. Therefore, load capacity that clock series Kin, ck, nck have to drive is 6Co, and power consumption P1 due to clock drive by a clock with a period $T_0$ is obtained by the following equation.

$$P1 = VCC^2 \times 5Co/T_0$$

Power consumption P2 which is required for driving of the clock input CK is obtained by the following equation.

$$P2 = VCC^2 \times Co/T_0$$

Power consumption which is required for drive of D and Q series may be once charged and discharged for time of (N+1)×To. Therefore, power consumption P3 which is required for drive of D and Q series of a DFF circuit is obtained by the following equation.

$$P3 = VCC^2 \times 6Co/\{T_0 \times (N+1)\}$$

Therefore, power consumption Pw1 of a shift register in FIG. 8 is obtained by the following equation (1) assuming that ratio of a period in which the clock CK to all periods is inputted is an operation period ratio K.

$$Pw1 = N \times (P1 + P2 + P3) \times K \tag{1}$$

As a system which uses this shift register as shown in FIG. 8, there is a display panel for displaying images. In the display panel, there are a liquid crystal panel in which a passing light emission amount is controlled by voltage applied of a liquid crystal element of each pixel, and an EL panel using EL (Electro-Luminescence) elements in which a light emission amount can be controlled in response to an amount of a current injected which is injected into each pixel.

Also, as a document for disclosing a structure of a shift register, JP-A-10-74060 is known.

SUMMARY AND OBJECT OF THE INVENTION

For example, power consumption Pw1 of a horizontal scanning shift register which is configured by a thin film transistor (TFT) circuit and used for a display panel of QVGA (320×240) is tried to be obtained by the equation (1). Power consumption of a vertical scanning shift register is likewise obtained by the equation (1), but since a vertical scanning clock cycle is more than 320 times larger than a horizontal scanning clock cycle, it can be neglected. Here, assuming that unit load capacity Co=50 fF of a switch and an inverter, power supply voltage VCC=10 v, effective operation period K=0.8, and the horizontal scanning clock cycle $T_0$=160 ns, $$P1 = 0.156 \text{ mW}$$

$$P2 = 3.125 \times 10^{-2} \text{ mW}$$

$$P3 = 5.84 \times 10^{-4} \text{ mW}$$

$$Pw1 = 320 \times (0.156 + 3.125 \times 10^{-2} + 5.84 \times 10^{-4}) \times 0.8 \text{ mW}$$

$$Pw1 = 48.1 \text{ mW}$$

are obtained. And it can be seen that power consumption components P1 (0.156×320×0.8=39.9 mW) and P2 (3.125× $10^{-2}$×320×0.8=8 mW) due to clock system drive occupy almost all.

Consumption of reactive power which is generated by this horizontal scanning shift register is generated regardless of a display image, and this becomes a big problem particularly in a display panel which is used for a portable device.

Also, considering a display panel which is configured by the TFT circuit likewise, inverter input capacity of the number of driver horizontal pixels which is configured by the TFT circuit likewise for driving of a clock input of a horizontal scanning shift register which is used has to be driven. On this account, in the TFT circuit in which current driving performance of a transistor can not be taken on a large scale, a driver circuit which requires a large scale (area) has to be incorporated.

Also, in a TFT process of a low-temperature polysilicon process, specific resistance of wiring is bigger than that in a CMOS (Complementary Metal-Oxide Semiconductor) process which used single crystal silicon, and there occurred a case that a driver of large-current driving destroys stable power voltage supply and makes an operation of a targeted horizontal scanning shift register unstable.

One example of concrete problems is as described above, and a structure having such a problem that power consumption is decreased in a shift register is disclosed in JP-A-10-74060.

A problem of this invention is to provide a structure which decreases power consumption in a shift register, and reduces the number of wiring of a shift register, and also, can realize a secure operation.

This invention is one which solved the above-described problem by means shown as follows.

That is, a first invention is a shift register, and, has a plurality of pulse generation portions for generating pulse signals in a chained manner in response to level change timing of clock signals to be inputted, wherein a part of the plurality of pulse generation portions belong to a shift pulse generation unit, and each part of the plurality of pulse generation portions belongs to different shift pulse generation units, and each shift pulse generation unit has a status signal generation circuit for outputting a status signal, which shows a status that at least one pulse generation portion which belongs to this unit generated a pulse signal, to common wiring to which both of an earlier shift pulse generation unit and a later shift pulse generation unit than the corresponding shift pulse generation unit are connected, and a clock supply circuit for supplying a clock signal to the pulse generation portion which belongs to this unit, wherein, there is a period in which the clock supply circuit supplies the clock signal to the pulse generation portion and a period in which the clock signal is not supplied, and during the period in which the clock signal is supplied, the status signal which shows a status that at least one pulse generation portion which belongs to the earlier shift pulse generation unit than the shift pulse generation unit to which itself belongs generated pulse signals is inputted from the earlier shift pulse generation unit, and the status signal which shows a status that the pulse generation portion which belongs to the later shift pulse generation unit generated pulse signals is not inputted from the later shift pulse generation unit, and the status signal for showing such a status that the pulse generation portion generated pulse signals is a signal which is more difficult to be deteriorated on the common wiring than the pulse signal.

Here, the plurality of pulse generation portions can employ various structures as a structure which belongs to a shift pulse generation unit which differs with respect to each partial pulse generation portion. The pulse generation portion which belongs to the shift pulse generation unit may be one or may be plural.

A second invention is of such a structure that, in the first invention, the clock supply circuit is one which does not supply the clock signal to the pulse generation portion, during a period that the status signal for showing a status that the pulse generation portion which belongs to the shift pulse generation unit generated the pulse signals is not inputted from the earlier shift pulse generation unit than the shift pulse generation unit to which the circuit itself belongs, and the status signal for showing a status that the pulse generation portion which belongs to the shift pulse generation unit generated the pulse signals is not inputted also from the later shift pulse generation unit.

A third invention is of such a structure that, in the first or the second invention, the clock supply circuit does not supply the clock signal to the pulse generation portion, during a period that the status signal for showing a status that the pulse generation portion which belongs to the shift pulse generation unit generated the pulse signals is inputted from the earlier shift pulse generation unit than the shift pulse generation unit to which itself belongs, and the status signal for showing a status that the pulse generation portion which belongs to the shift pulse generation unit generated the pulse signals is inputted also from the later shift pulse generation unit.

With regard to a structure which makes the status signal for showing a status that the pulse generation portion generated the pulse signals a signal which is more difficult to be deteriorated on the common wiring than the pulse signal, various artifices are possible, and in particular, it is preferable to make a width of a pulse of the status signal for showing a status that the pulse generation portion generated the pulse signals wider than a width of a pulse of the pulse signal. This is a fourth invention.

An inventor of this application focused on a point that if it is tried to output the status signal for showing a status that the pulse signals were generated from the pulse generation portion of the focused shift pulse generation unit to each of (the clock supply circuit of) the earlier shift pulse generation unit and (the clock supply circuit of) the later shift pulse generation unit than a certain shift pulse generation unit (focused shift pulse generation unit) through separate wiring, the number of wiring is increased. Then, the inventor of this invention conducted his study with all his heart, and reached an invention that the status signal is transferred through the common wiring to the earlier shift pulse generation unit and the later shift pulse generation unit respectively. However, it was found that there occurs a particular problem in a structure which uses the common wiring. That is, if employed is a structure which uses the pulse signal itself that the pulse generation portion generates as the signal for showing a status that the pulse signal was generated from the pulse generation portion of the focused shift pulse generation unit, deterioration of the signals is large on the common wiring to which both of the earlier shift pulse generation unit and the later shift pulse generation unit are connected therefore certainty of the operation is reduced. In this connection, the inventor of this application studied further, and came up with such a structure that the pulse signal itself from the pulse generation portion is not transferred to another shift pulse generation unit, and provided is a status signal generation circuit for generating a status signal of a state that it is difficult to be deteriorated as compared to deterioration which occurs in case that the pulse signal itself was supplied to the common wiring. For example, it is possible to suppress the above-described deterioration by use of the status signal with wider width than pulse width of the pulse signal.

A fifth invention is of a structure that, in each invention which was described above, the status signal generation circuit changes level of a signal to be outputted, in sync with a fact that at least one pulse generation portion which belongs to the shift pulse generation unit to which the circuit itself belongs generates the pulse signal. In case that there are two levels as the signal which the status signal generation circuit outputs, it may be configured such that the status signal with one level corresponds to the status signal for showing a status that at least one pulse generation portion which belongs to the shift pulse generation unit to which the circuit itself belongs generates the pulse signal, and the other level corresponds to a level (reset level) which was changed from the above-described one level by resetting. It may be configured such that when a signal with the reset level is inputted from another shift pulse generation unit, the clock supply circuit carries out control as the pulse generation portion which belongs to the shift pulse generation unit does not generate the pulse signal. That is, the clock supply circuit compares levels of signals which are inputted from respective status signal generation circuits of the earlier shift pulse generation unit and the later shift pulse generation unit, and in response to a result of comparison, can determine as to whether the clock signal is supplied to the pulse generation portion or not.

A sixth invention is a shift register has, a plurality of pulse generation portions for generating pulse signals in a chained manner in response to level change timing of clock signals to be inputted, wherein a part of the plurality of pulse generation portions belongs to shift pulse generation units, and each part of the plurality of pulse generation portions belongs to different shift pulse generation units, and each shift pulse generation unit has a status signal generation circuit for outputting a status signal which shows a status that at least one pulse generation portion which belongs to this unit generated a pulse signal, to common wiring to which both of an earlier shift pulse generation unit and a later shift pulse generation unit than the corresponding shift pulse generation unit are connected, and a clock supply circuit for supplying a clock signal to the pulse generation portion which belongs to this unit, wherein, there is a period in which the clock supply circuit supplies the clock signal to the pulse generation portion and a period in which the clock signal is not supplied, and during the period in which the clock signal is supplied, the status signal which shows a status that at least one pulse generation portion which belongs to the earlier shift pulse generation unit than the shift pulse generation unit to which itself belongs generated pulse signals is inputted from the earlier shift pulse generation unit, and the status signal which shows a status that the pulse generation portion which belongs to the later shift pulse generation unit generated pulse signals is not inputted from the later shift pulse generation unit, and the status signal for showing such a status that the pulse generation portion generated pulse signals has a wider pulse width than the pulse signal.

In addition, this application includes an invention of a display apparatus which used a shift register which relates to the above-described each invention. More specifically, it may have more display elements. As the display element, it is possible to employ various structures such as a display element which includes a liquid crystal device, a display element which includes an electroluminescence device, a display element which includes an electron emission device and the like.

The pulse signal which is outputted in a chained manner from a shift register can be used as a signal which defines timing for sampling, for example, image signals.

BRIEF DESCRIPTION OF THE DRAWINGS

The invention, together with further advantages thereof, may best be understood by reference to the following description taken in conjunction with the accompanying drawings in which:

FIG. 1A shows an intermediate scanning part of the shift register, and FIG. 1B shows a start scanning part of the shift register, and FIG. 1C shows an end scanning part of the shift register;

FIG. 2A is a time chart for explaining operations of FIG. 1A, FIG. 2B is a time chart for explaining operations of FIG. 1B, and FIG. 2C is a time chart for explaining operations of FIG. 1C;

FIG. 3A shows an intermediate scanning part of the shift register, FIG. 3B shows a start scanning part of the shift register, and FIG. 3C shows an end scanning part of the shift register;

FIG. 4A is a time chart for explaining operations of FIG. 3A, FIG. 4B is a time chart for explaining operations of FIG. 3B, and FIG. 4C is a time chart for explaining operations of FIG. 3C;

FIGS. 7A to 7B are circuit diagrams of a clock gate circuit (CKG) which is used in a shift register of the invention, FIG. 7A shows a clock gate circuit (CKG) which is used in the shift register shown in FIGS. 1A to 1C, and FIG. 7B shows a clock gate circuit (CKG) which is used in the shift register shown in FIGS. 3A to 3C;

FIG. 12A is a circuit diagram of the pixel circuit with the current setting system, and FIG. 12B is a time chart for explaining operations of the pixel circuit of FIG. 12A;

FIG. 13A is a circuit diagram of the pixel circuit with the current setting system, and FIG. 13B is a time chart for explaining operations of the pixel circuit of FIG. 13A;

FIG. 15 is a time chart for explaining operations of the EL device drive control circuit shown in FIG. 14;

FIG. 16A is a circuit diagram of the voltage-current conversion circuit, and FIG. 16B is a view for explaining a voltage-current conversion characteristic of FIG. 16A;

FIG. 17A is a circuit diagram of the voltage-current conversion circuit, and FIG. 17B is a view for explaining a voltage-current conversion characteristic of FIG. 16A;

FIG. 21 is a time chart for explaining operations of the EL panel shown in FIG. 18; and FIG. 22 is a view for showing a structure of an information display apparatus.

DETAILED DESCRIPTION OF THE PREFERRED EMBODIMENTS

Figure 1A:
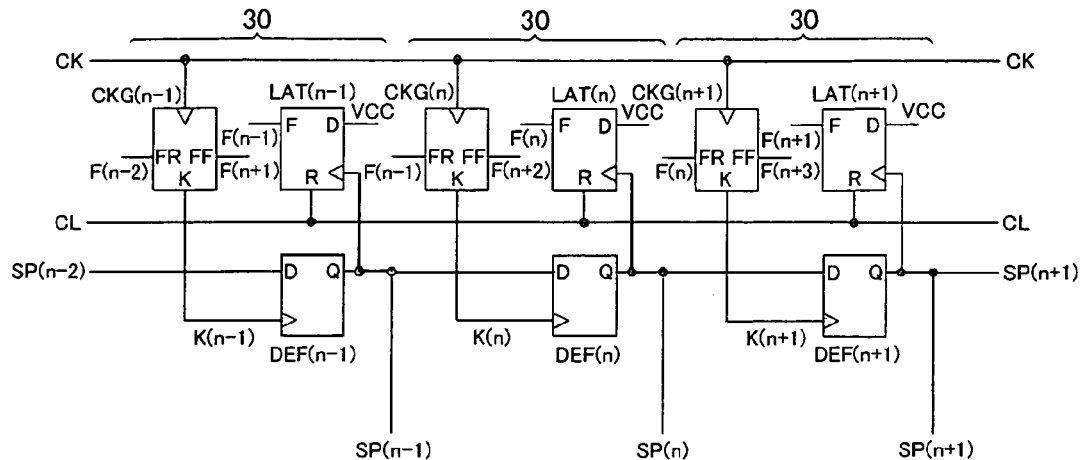
FIGS. 1A to 1C are views showing one embodiment of a shift register of the invention.

Firstly, this invention will be described by use of FIG. 1 showing an embodiment 1 which will be described later, but this invention is not limited to this embodiment.

As shown in FIG. 1, in this invention, provided are a plurality of shift pulse generation units 30 (hereinafter, simply referred to unit) each of which includes pulse generation portion (a register circuit DFF(n): n is an integer and the same is applied below), a status signal generation part (a latch circuit LAT(n) as the status signal generation circuit), and a clock extraction part (a clock gate circuit CKG(n)) which is a clock supply circuit.

A clock signal line (CK) through which clock signals are inputted to all units 30 is connected to each clock extraction part CKG.

With regard to the pulse generation portion DFF, in the same manner as in a conventional shift register, Q output terminals and D input terminals are connected in sequence between the pulse generation portions DFF so as to generate pulse signals in a chained manner in response to level change timing of clock signals to be inputted. In this invention, it is the clock extraction part CKG to input clock signals to this pulse generation portion DFF.

The status signal generation part LAT has a function for changing the status signal from a first status to a second status when the status signal is outputted from a latch output terminal F to the clock extraction part CKG which is included in earlier and later shift pulse generation units than the corresponding shift pulse generation unit (assuming that the corresponding unit is an (n)th unit, an (n−1)th or earlier unit and an (n+1)th or later unit), and the pulse generation portion DFF generated pulse signals. Wiring which is connected to the latch output terminal F is common wiring, and to this common wiring, a clock extraction part of a shift pulse generation unit which is two earlier than the shift pulse generation unit to which this status signal generation part LAT belongs and a clock extraction part of a shift pulse generation unit which is one later are connected, and latch outputs are transferred at the same time through the common wiring, respectively. In a configuration of FIG. 1, Q output terminals of pulse generation portions which are included in respective units 30 are also connected to the status signal generation parts LAT, and the status signal generation part LAT thereby detects occurrence of pulse signals in the pulse generation portion. In the configuration of FIG. 1, the latch output terminal F(n) is connected to a forward status signal input terminal FR of CKG(n+1) and to a rearward status signal input terminal of CKG(n−2) (not shown), and the status signal is outputted to these clock extraction parts.

In addition, in this invention, meaning of a front or rear unit is front or rear in a order which is defined by the pulse generation portions which are connected in sequence so as to generate pulse signals in a chained manner.

Also, the first status and the second status of the status signal represent certain statuses which differ to each other, and for example, the first status may be an L (GND ground potential) status and the second status may be an H (VCC power supply potential) status, or they may be reversed and the like, but it is not limited to them.

The clock extraction part CKG, which is included in the plurality of shift pulse generation units in which at least intermediate portions are continued, has a function for inputting clock signals which respond to clock signals which are inputted from the clock signal line CK from an extraction clock output terminal K to the pulse generation portion DFF, during only a period that the status signal which is inputted from an earlier shift pulse generation unit than the corresponding shift pulse generation unit is in the second status, and the status signal which is inputted from a later shift pulse generation unit than the corresponding shift pulse generation unit is in the first status. In the configuration of FIG. 1, the forward status signal input terminal FR of CKG(n) is connected to F(n−1), and the rearward status signal input terminal FF is connected to F(n+2) (not shown), and it is designed that they are operated by the status signals which are inputted from them, respectively.

Assuming that an earlier unit than the corresponding unit is a unit A, and a later unit is a unit B, during a period that both of the status signals which are inputted from the units A and B are in the first status, the corresponding unit is within a waiting period that it does not generate a pulse immediately, and during such a period that both of the status signals which are inputted from the units A and B are in the second status, the corresponding unit is within a waiting period for a next start of scanning that it has already generated pulses. In sum, a period that two status signals are in different status each other is a period that the status signal which is inputted from the unit A is in the second status, and the status signal which is inputted from the unit B is in the first status, in the unit A, the pulse generation portion has already generated pulses, and in the unit B, it has not yet generated pulses, and becomes a period in which only a necessary portion was extracted including a period that the corresponding unit generates pulses, out of all periods of one scanning.

As above, by inputting the clock signals which are inputted in all periods to the pulse generation portion DEF during only a necessary period by utilizing the status signals which are inputted from the earlier and later units, clocks are inputted to the pulse generation portion so that it is possible to considerably reduce a period for charging and discharging load capacity of the pulse generation portion, and it becomes possible to reduce power consumption in the pulse generation portion and to change an entire shift register to a low power consumption one.

It is fine if appropriate ones are selected one by one as the earlier and later units which become subjects to which the status signal generation part LAT outputs the status signals, but a period that the clock extraction part CKG extracts clock signals is defined by this selection, and in case that a unit which was more distant from the corresponding unit was selected, a period in which the clock extraction part extracts clock signal is getting longer and an advantage of power saving is getting smaller that much. However, as compared to a case that immediate earlier and immediate later units (assuming that the corresponding unit is an (n)th unit, (n−1)th and (n+1)th units) are selected from a purpose for shortening an extraction period of the clock signals as much as possible, by selecting earlier and later units considering a safety period to pulse delay which differs according to a connection topology of circuits in such a manner that as in the configuration shown in FIG. 1, an immediate earlier ((n−1) to (n)) unit and a two stage later ((n+2) to (n)) unit are selected, or as in the configuration shown in FIG. 3, a two stage earlier ((n−2) to (n)) unit and an immediately later (n+1) to (n)) unit are selected and the like, it is possible to shorten the extraction period of the clock signal and at the same time, it is possible to ensure certainty of shift of pulses in a chained manner.

[Embodiment 1]

Figure 1B:
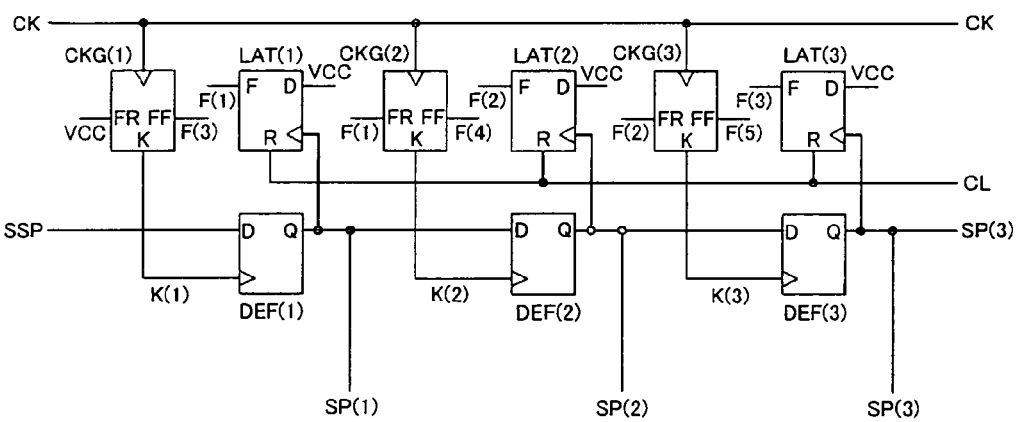
Figure 1C:
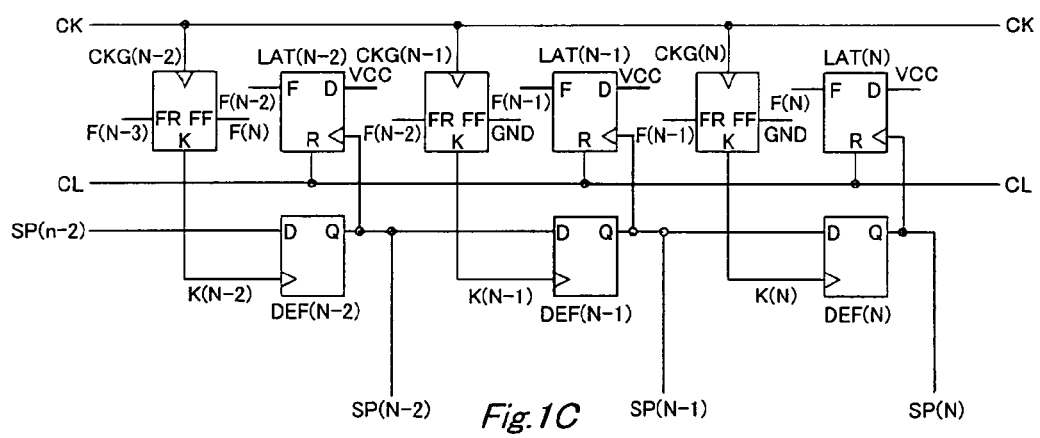
Figure 8:
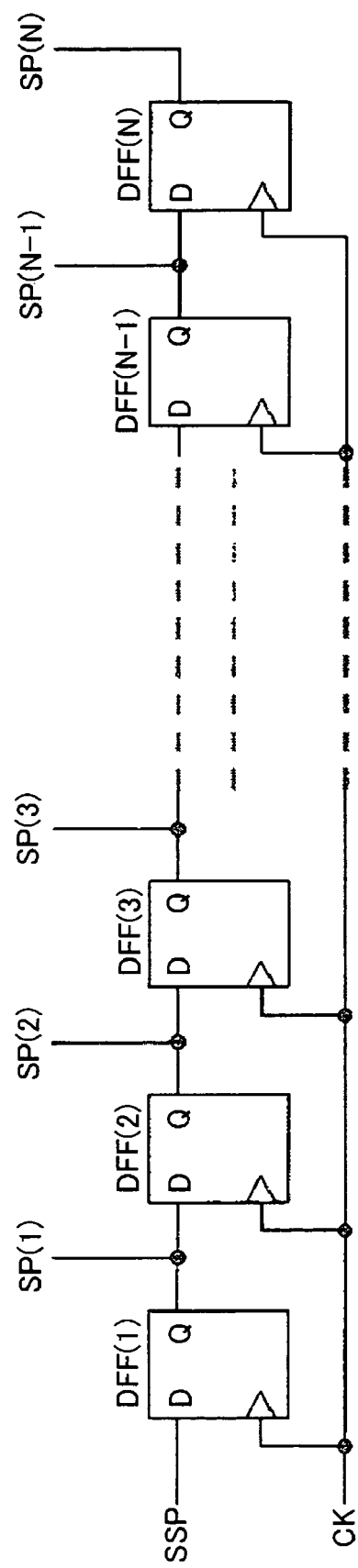
FIG. 8 is a circuit diagram of a conventional shift register.
Figure 9:
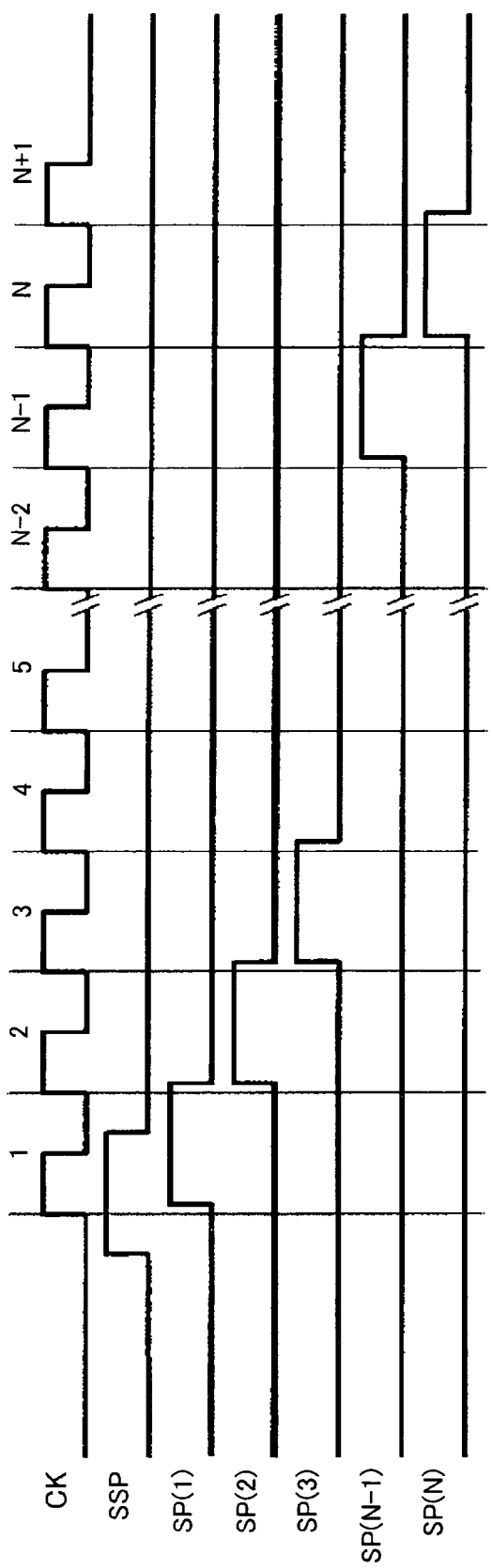
FIG. 9 is a time chart for explaining operations of FIG. 8.

FIGS. 1A to 1C show one embodiment of a shift register of this invention, and in the same manner as in the conventional shift register of FIG. 8, it generates a group of N pieces of pulse signals. FIG. 1A shows an intermediate scanning part of the shift register, and FIG. 1B shows a start scanning part of the shift register, and FIG. 1C shows an end scanning part of the shift register.

<Intermediate Scanning Part>

FIG. 1A shows three units 30 of (n−1)th, (n)th and (n+1)th which were arranged arbitrarily in between.

The input clock signal CK is inputted to respective clock signal input terminals of the clock gate circuits CKG(n−1), CKG(n) and CKG(n+1).

From the extraction clock output terminal K of CKG(n−1), the clock signal K(n−1) is outputted and inputted to the extraction clock signal input terminal of the register circuit DFF(n−1), and to the D input terminal D of DFF(n−1), the pulse signal SP(n−2), which is outputted from the Q output terminal Q of DFF(n−2) in a previous stage, is inputted, and the Q output of DFF(n−1) is outputted as SP(n−1) and inputted to the clock input terminal of the latch circuit LAT(n−1) and the D input of DFF(n) in a next stage. The D input of LAT(n−1) is connected to the power supply VCC, and the latch output F of LAT(n−1) is outputted as F(n−1).

From the extraction clock output K of CKG(n), K(n) is outputted, and inputted to the extraction clock signal input terminal of DFF(n), and the Q output of DFF(n) is outputted as SP(n) and inputted to the clock input terminal of the latch circuit LAT(n) and the D input of DFF(n+1) in a next stage. The D input of LAT(n) is connected to the power supply VCC and the latch output F of LAT(n) is outputted as F(n).

From the extraction clock output K of CKG(n+1), K(n+1) is outputted, and inputted to the extraction clock signal input terminal of DFF(n+1), and the Q output of DFF(n+1) is outputted as SP(n+1) and inputted to the clock input terminal of the latch circuit LAT(n+1) and the D input of DFF(n+2) in a next stage. The D input of LAT(n+1) is connected to the power supply VCC and the latch output F of LAT(n+1) is outputted as F(n+1).

To respective reset terminals R of LAT(n−1), LAT(n) and LAT(n+1), the reset signal CL is inputted.

To the forward status signal input terminal FR input of CKG(n−1), the (n−2)th status signal F(n−2) is inputted and to the rearward status signal input terminal FF input, the (n+1)th status signal F(n+1) is inputted.

To the forward status signal input terminal FR input of CKG(n), the (n−1)th status signal F(n−1) is inputted and to the rearward status signal input terminal FF input, the (n+2)th status signal F(n+2) is inputted.

To the forward status signal input terminal FR input of CKG(n+1), the (n)th status signal F(n) is inputted and to the rearward status signal input terminal FF input, the (n+3)th status signal F(n+3) is inputted.

Figure 6:
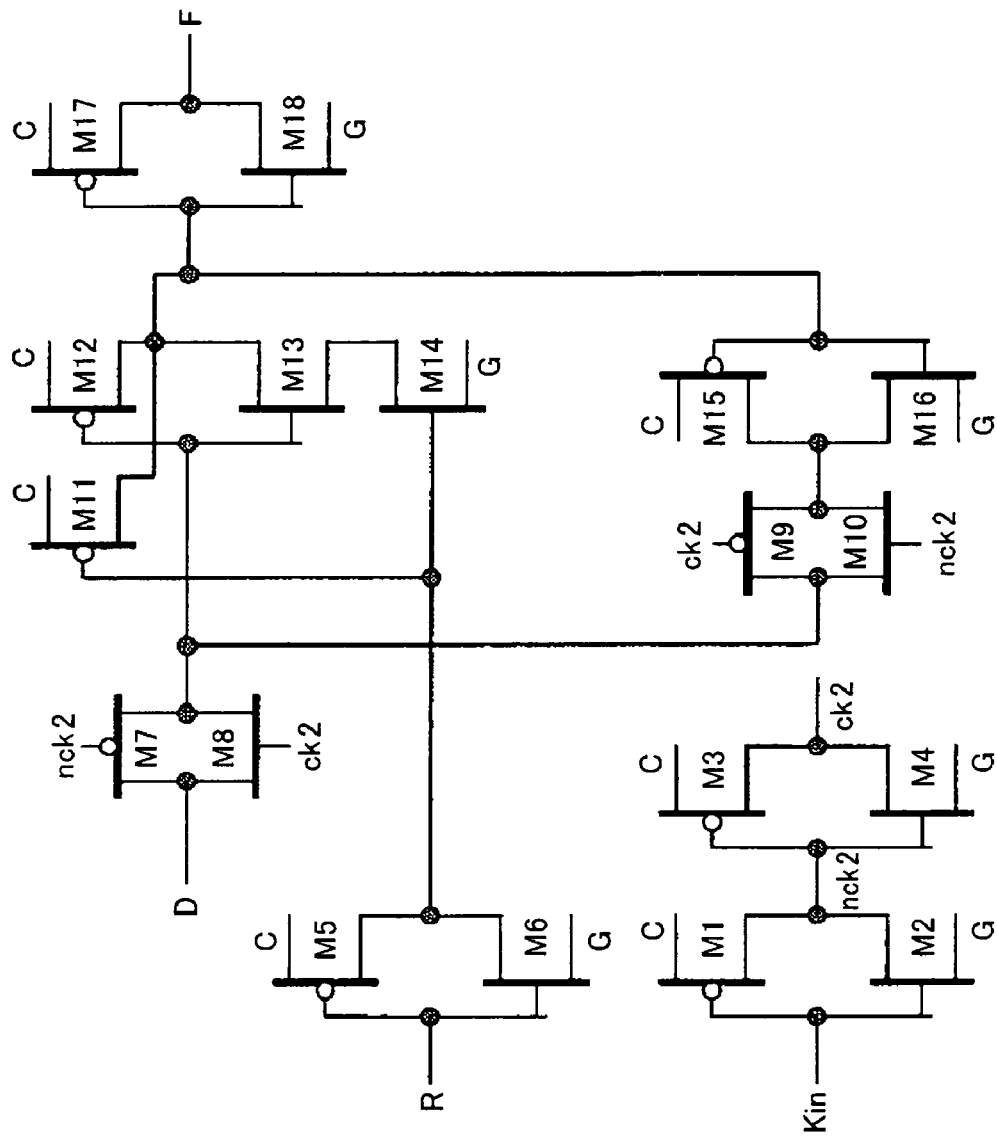
FIG. 6 is a circuit diagram of a latch circuit (LAT) which is used in FIGS. 1A to 1C and FIGS. 3A to 3C.

An example of a structure of the latch circuit LAT is shown in FIG. 6. Since the structure of FIG. 6 is a common one, description thereof will be omitted.

An example of a structure of CKG is shown in FIG. 7A.

From an AND logic circuit, which is configured by M1 to M8, of the forward status signal input terminal FR and a reversed rearward status signal input terminal FFB for generating a clock gate signal f, the clock gate signal f is inputted to a NAND circuit which is connected to the clock signal input terminal CLK and configured by M9 to M12 to thereby output a positive clock ck and a negative clock nck.

Figure 10:
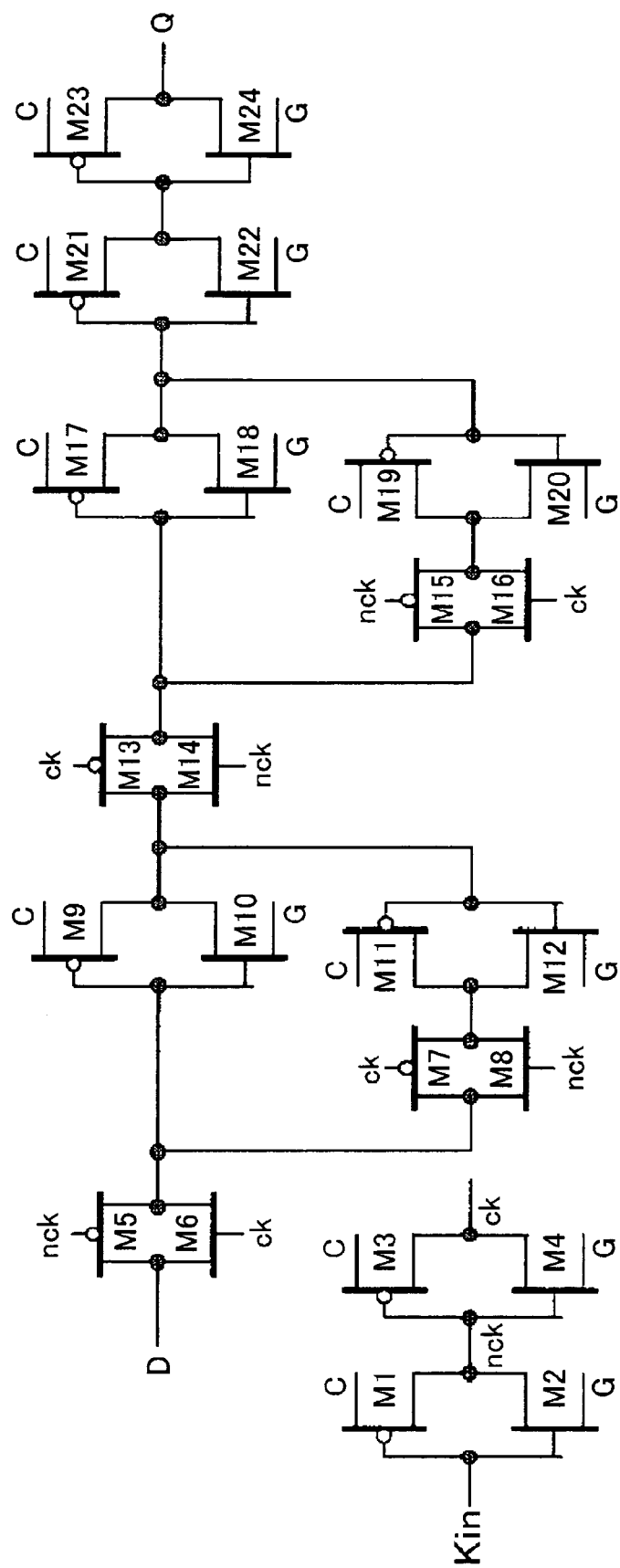
FIG. 10 is a circuit diagram of a register circuit which is used in the shift register shown in FIGS. 1A to 1C and FIG. 8.

DFF(n−1), DFF(n) and DFF(n+1) which are used in FIG. 1A are of the same structure shown in FIG. 10, but since the clock buffer, which is configured by M1 to M4 in FIG. 10, is included in CKG(n−1) to CKG(n+1), it is not necessary.

Operations of FIG. 1A will be described by use of a time chart of FIG. 2A.

Figure 2A:
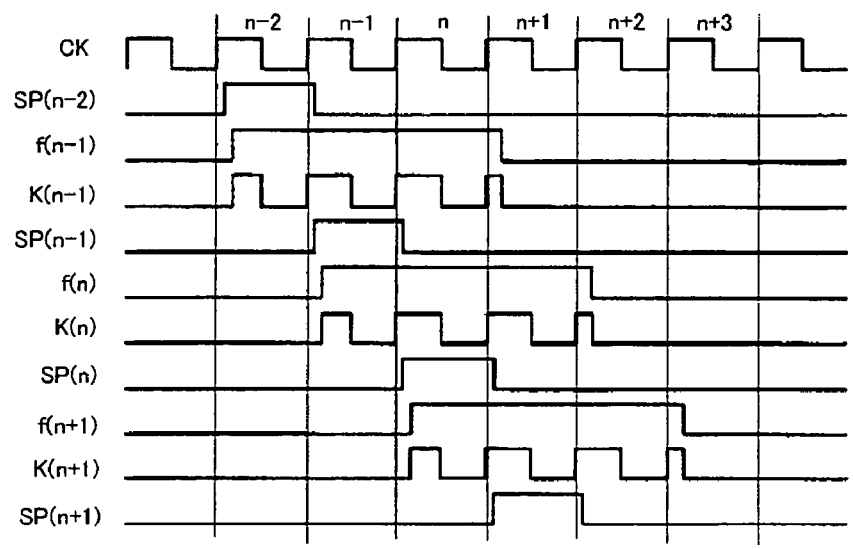
FIGS. 2A to 2C are time charts for explaining operations of the shift register shown in FIG. 1.

During a period that pulses are generated from the pulse generation means, the reset signal CL is in L level, and before the period shown in FIG. 2A, all LAT circuits are to be reset in advance. The input clock signal CK shows (n−2)th to (n+3)th clock cycle periods.

(n−2) Clock Period

It is assumed that, to the Q output of DFF(n−2), as shown in the figure, SP(n−2), which is generated by (n−2)th and (n−1)th clocks, is outputted.

The clock gate signal f(n−1) in CKG(n−1), since F(n+1) is in L level, is changed to H level at a time point that F(n−2) is fixed to H level to thereby start the clock output of K(n−1). However, since F(n−1) and F(n) are in L level at this time point, the clock gate signals f(n) and f(n+1) remain in L level, and both of K(n) and K(n+1) do not generate clock signals.

(n−1) Clock Period

The clock gate signal f(n−1) is kept in H level continuously since F(n+1) is in L level and F(n−2) is in H level, and thereby, the clock output of K(n−1) is outputted.

At a ↑ timing of the (n−1)th clock, DFF(n−1) takes in SP(n−2) and SP(n−1) is changed to H level, and at a ↑ timing of the (n)th clock, it takes in SP(n−2) again to have SP(n−1) changed to L level.

The clock gate signal f(n) is changed to H level at a time point that F(n−1) is fixed to H level to thereby start the clock output of K(n), but since F(n) is in L level at this time point, the clock gate signal f(n) is kept in L level so that K(n+1) does not generate clock signals.

(n) Clock Period

The clock gate signal f(n−1) is in H level continuously since F(n+1) is in L level and F(n−2) is in H level, and the clock output of K(n−1) is outputted. On that account, at a ↑ timing of the (n)th clock, it takes in SP(n−2) again and it is possible to carry out an operation for changing SP(n−1) to L level.

The clock gate signal f(n) is in H level continuously since F(n+2) is in L level and F(n−1) is in H level, and the clock output of K(n) is outputted continuously.

At a ↑ timing of the (n)th clock, DFF(n) takes in SP(n−1) and SP(n) is changed to H level, and at a ↑ timing of the (n+1)th clock, it takes in SP(n−1) again to have SP(n) changed to L level.

The clock gate signal f(n+1) is changed to H level at a time point that F(n) is fixed to H level to thereby start the clock output of K(n+1).

(n+1) Clock Period

The clock gate signal f(n) is in H level since F(n+2) is in L level and F(n) is in H level, and the clock output of K(n) is outputted. Therefore, at a ↑ timing of the (n+1)th clock, it takes in SP(n−1) again and it is possible to carry out an operation for changing SP(n) to L level.

The clock gate signal f(n+1) is in H level continuously since F(n+3) is in L level and F(n) is in H level, and the clock output of K(n) is outputted continuously.

At a ↑ timing of the (n+1)th clock, DFF(n+1) takes in SP(n) and SP(n+1) is changed to H level, and at a ↑ timing of the (n+2)th clock, it takes in SP(n) again to have SP(n+1) changed to L level.

The clock gate signal f(n−1) is changed to L level at a time point that F(n+1) is fixed to H level to thereby stop the clock output of K(n−1).

(n+2) Clock Period

The clock gate signal f(n+1) is in H level since F(n+3) is in L level and F(n+1) is in H level, and therefore, the clock output of K(n+1) is outputted. Therefore, at a ↑ timing of the (n+2)th clock, it takes in SP(n) again and it is possible to carry out an operation for changing SP(n+1) to L level.

The clock gate signal f(n) is changed to L level at a time point that F(n+2) is fixed to H level to thereby stop the clock output of K(n).

(n+3) Clock Period

The clock gate signal f(n+1) is changed to L level at a time point that F(n+3) is fixed to H level to thereby stop the clock output of K(n+1).

Assumption that SP(n−2) is outputted by the (n−2) clock and the (n−1) clock can be proved if DFF(n−2), LAT(n−2) and CKG(n−2) are connected by the same structure. SP(n−1) to SP(n+1) exhibit wave forms of a desired group of pulse signals which are the same as in the shift register in FIG. 8.

<Start Scanning Part>

FIG. 1B shows a structure of a start scanning part, and in the same manner as in FIG. 1A, (n=1 to 3)th units of units which are configured by DFF, LAT and CKG are shown.

To FR and FF inputs of each of CKG(2) and CKG(3), the 1 stage earlier status signal and the 2 stage later status signal are inputted, respectively. However, to the FF input of CKG(1), the 2 stage later status signal F(3) is inputted, but to the FR input, the power supply VCC is inputted. This relates to a fact that the first status of the status signal is the L status and the second status is the H (power supply VCC) status. That is, this is because, since the earlier shift pulse generation unit does not exist in at least the shift pulse generation unit which generates pulse signals in the first place out of the plurality of shift pulse generation units, instead of the status signal which is inputted from the earlier shift pulse generation unit than the corresponding shift pulse generation unit, it is desirable to input the same signal as the status signal of the second status. By this, it becomes possible to make all shift pulse generation units the same circuit structure.

Figure 2B:
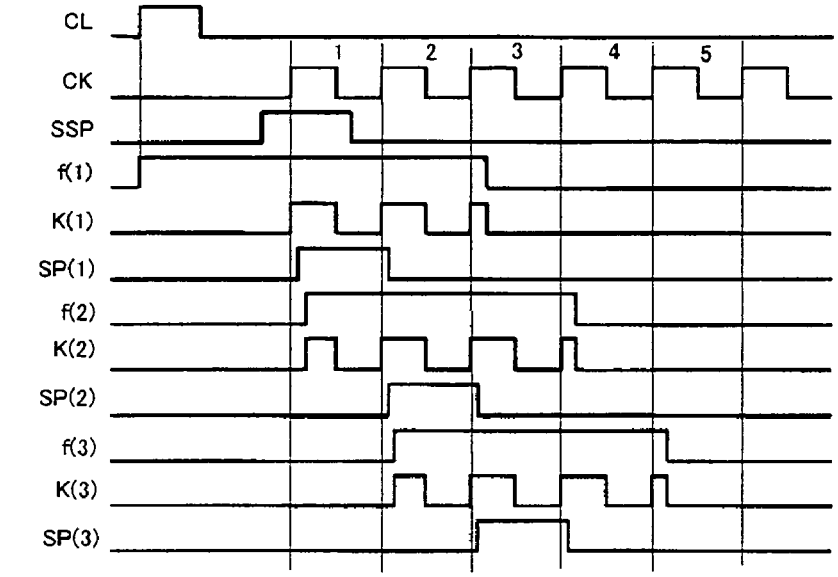

FIG. 2B is a time chart for explaining operations of FIG. 1B. The reset signal CL is in H level for a predetermined period prior to input of the 1st clock, and therefore, all LAT circuits are reset so that the status signal is turned in the first status (GND potential).

Before the reset signal CL becomes H level, as can be seen from the explanation of FIG. 1A, all of the clock gate signals f(1), f(2), and f(3) are in L level. Even if the reset signal CL becomes H level and F(1), F(4) and F(2), F(5) are changed to L level, f(2) and f(3) are kept in L level, but when F(3) is changed to L level, the clock gate signal f(1) is changed to H level since the FR input is connected to the power supply VCC and is in H level and can be outputted to the clock K(1). However, at this time point, the 1st clock is not inputted and therefore, no clock is generated at the clock K(1).

The scanning start signal SSP, which becomes H level between ↑ timing of the 1st clock and ↑ timing of a 2nd clock, is inputted to the D input of DFF(1), and when the 1st clock is inputted, clocks are generated at K(1) and SP is taken in DFF(1) and SP(1) is changed to H level. After that, when the 2nd clock is inputted to DFF(1), SP is taken in again and SP(1) is changed to L level.

Remaining operations are the same as the operations FIG. 1A, description thereof will be omitted.

<End Scanning Part>

FIG. 1C shows a structure of the end scanning part, and in the same manner as in FIG. 1A, (n=N−2 to N)th units of units which are configured by DFF, LAT and CKG are shown.

To each of FR and FF inputs of CKG(N−2), the 1 stage earlier status signal and the 2 stage later status signal are inputted, respectively. Also, to the FR inputs of CKG(N−1) and CKG(N), the 1 stage earlier status signal F(N−2) and F(N−1) are inputted, respectively, but the FF input is connected to the ground GND. This relates to a fact that the first status of the status signal is the L status and the second status is the H (power supply VCC) status in the same manner as the start scanning part. That is, this is because, since the later shift pulse generation unit does not exist in at least the shift pulse generation unit which generates pulse signals in the last place out of the plurality of shift pulse generation units, instead of the status signal which is inputted from the later shift pulse generation unit than the corresponding shift pulse generation unit, it is desirable to input the same signal as the status signal of the first status. By this, it becomes possible to make all shift pulse generation units the same circuit structure.

Since operations prior to the (N+1)th clock are the same as the operations of the intermediate scanning part of FIG. 1A, description thereof will be omitted.

Since the FF inputs of CKG(N−1) and CKG(N) are in L level (GND ground), the clock gate signal f(N−1) and f(N) are kept in H level continuously. However, since the clock CK is terminated at its (N+1)th one, after that, no clock is generated at K(N−1) and K(N). After a predetermined time has passed since termination of the (N+1)th clock, since the reset signal CL becomes H level and the F(N−2) and F(N−1) become L level, the clock gate signals f(N−1) and f(N) are changed to L level so that output statuses of K(N−1) and K(N) are stopped.

After that, the reset signal CL is changed again to L level to thereby wait for the 1st clock, and from the 1st clock, operations of FIG. 2B will be carried out again.

The shift register which was described above and has the structures of FIGS. 1A to 1C can output a desired group of pulse signals SP(1) to SP(N) by inputting the clock CK and the scanning start signal SSP and the reset signal CL.

<Power Consumption of Shift Register of Embodiment 1>

In calculation of power consumption, in the same manner as in the conventional shift register of FIG. 8, power consumption of the MOS circuit is generated by such an activity that a push-pull circuit, which is represented by an inverter and which comprises P type transistors and N type transistors, charges and discharges capacity which is added to this node. Capacity of the MOS circuit is mainly caused by channel capacity Cox which is generated between a gate oxide film and a channel. Here, simply, a switch circuit in which a gate is of low impedance (push-pull output) and an inverter circuit have the same load capacity Co.

Firstly, since the clock buffers M1 to M4 are removed from the DFF circuit of FIG. 10, power consumption P4 which is required for driving of the clock system of the DFF circuit is obtained by the following equation.

$$P4=VCC^2 \times 4Co/To$$

Power consumption P5 which is required for driving D and Q systems of the DFF circuit is obtained by the following equation, assuming that the number of pulses of a desired group of pulse signals is N.

$$P5=VCC^2 \times 6Co/\{To \times (N+1)\}$$

Power consumption P6 which is required for driving of the clock system of the CKG circuit shown in FIG. 7A is obtained by the following equation.

$$P6=VCC^2 \times 3Co/To$$

Power consumption P7 which is required for driving of the clock input is obtained by the following equation.

$$P7=VCC^2 \times Co/To$$

Power consumption P8 which is required for driving of FR and FF in the CKG circuit is obtained by the following equation.

$$P8=VCC^2 \times 5Co/\{To \times (N+1)\}$$

Power consumption P9 of the LAT circuit is obtained by the following equation.

$$P9=VCC^2 \times 9Co/\{To \times (N+1)\}$$

Considering the power consumption Pw2 of the shift register which is configured in FIGS. 1A to 1C, four clocks are simply inputted to the DFF circuit as each register, and 3 clocks are inputted to the final stage DFF(N), but here, simply, it is assumed that four clocks are inputted.

Figure 2C:
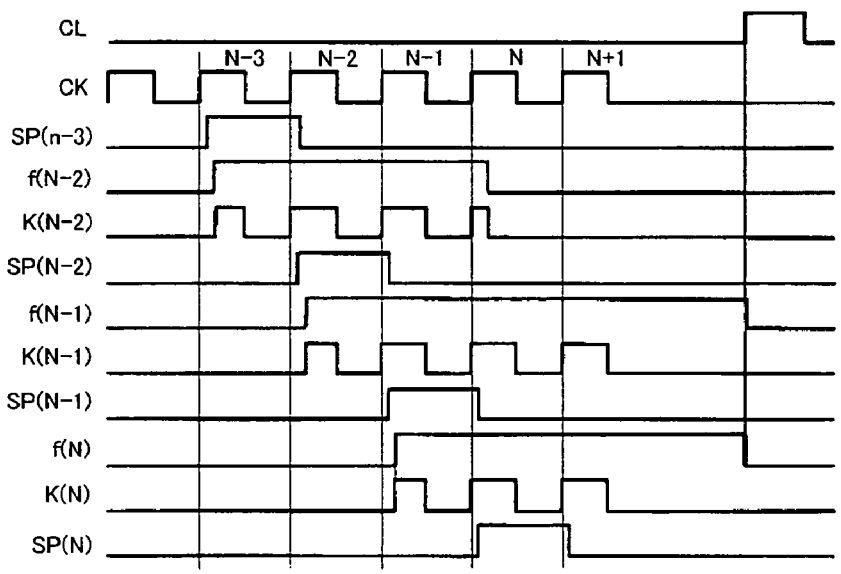

Also, as can be seen from the timing charts of FIGS. 2A to 2C, clocks are simultaneously inputted to three registers. In addition, considering the effective operation period K which shows a clock input period to an entire period, the power consumption Pw2 is obtained by the following equation (2).

$$Pw2=N \times [\{3 \times 4/(N+1)\} \times P4+P5+\{3 \times 4/(N+1)\} \times P6+P7+P8+P9] \times K \quad (2)$$

Figure 11:
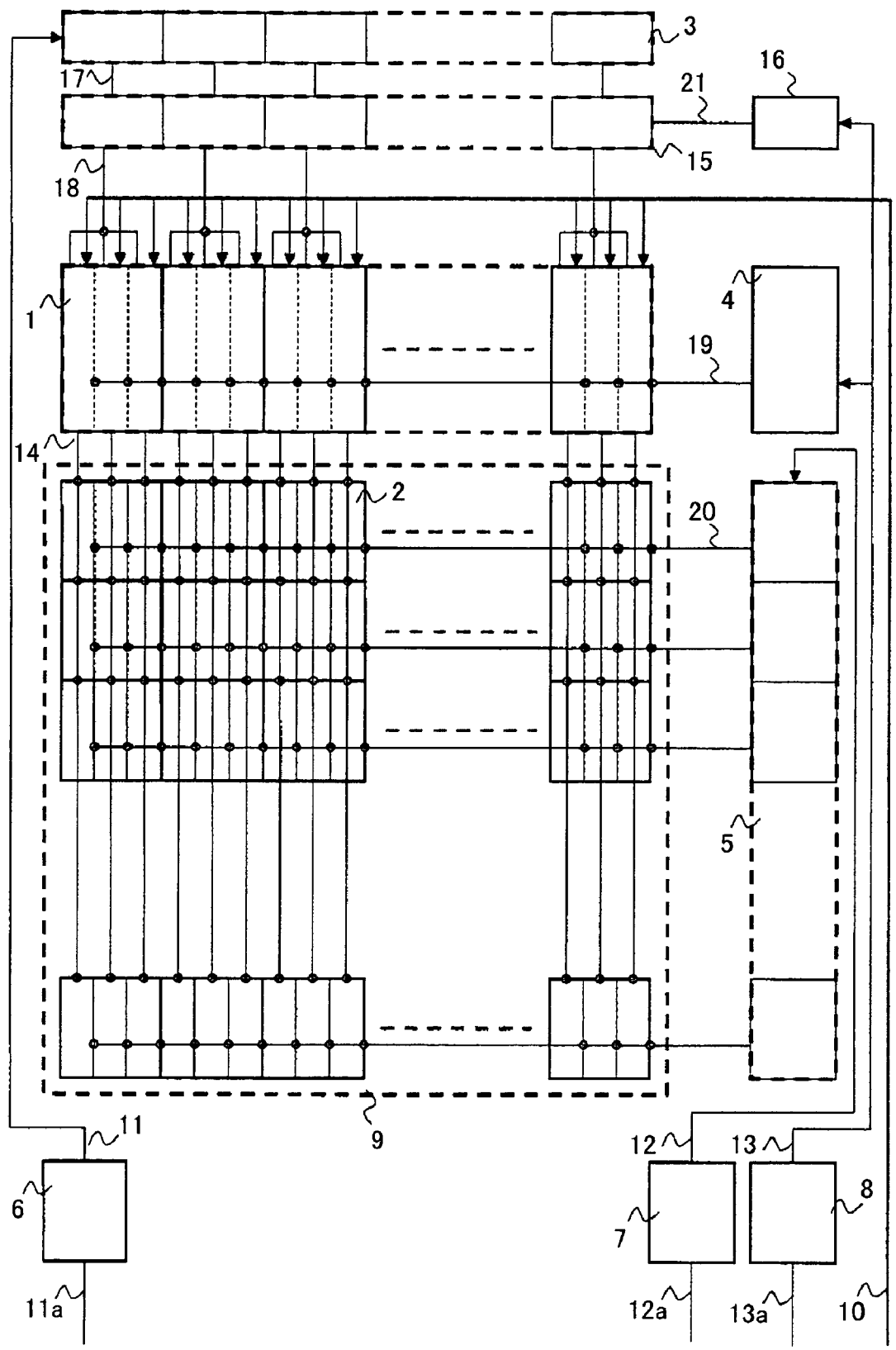
FIG. 11 is a circuit diagram of an entire circuit of an EL panel with a current setting system.

For example, power consumption Pw2 of the horizontal scanning shift register 3 which is configured by a thin film transistor (TFT) circuit shown in FIG. 11 and used for a display panel of QVGA (320×240) is tried to be obtained by the equation (2). Power consumption of the vertical scanning shift register 5 is likewise obtained by the equation (2), but since a vertical scanning clock cycle is more than 320 times larger than a horizontal scanning clock cycle, it can be neglected. Here, assuming that unit load capacity Co=50 fF of a switch and an inverter, power supply voltage VCC=10 v, effective operation period K=0.8, and the horizontal scanning clock cycle To=160 ns, $$P4=0.125 \text{ mW}$$

$$P5=5.84 \times 10^{-4} \text{ mW}$$

$$P6=9.38 \times 10^{-2} \text{ mW}$$

$$P7=3.125 \times 10^{-2} \text{ mW}$$

$$P8=4.87 \times 10^{-4} \text{ mW}$$

$$P9=8.76 \times 10^{-4} \text{ mW}$$

$$Pw2=320 \times (4.67 \times 10^{-3}+5.84 \times 10^{-4}+3.50 \times 10^{-3}+3.125 \times 10^{-2}+4.87 \times 10^{-4}+8.76 \times 10^{-4}) \times 0.8 \text{ mW}$$

$$Pw2=10.6 \text{ mW}$$

This means that the power consumption Pw1 of the conventional shift register of FIG. 8 shown by the equation (1)=48.1 mW is reduced to approximately 22% thereof.

The shift register of the embodiment 1 which was described above is not limited to the structures of FIGS. 1A to 1C. With regard to the status signal F(x) to be inputted to the forward status signal input terminal FR(n) and the status signal F(y) to be inputted to the rearward status signal input terminal FF(n), both of which are inputted to CKG(n) of an arbitrary integer stage n, if integers x and y satisfy the following relationship, it is possible to have it operate logically.

x<n; but, when x<1, the FR input is connected to the power supply VCC.

y>n; but, when y>N, the FF input is connected to the ground GND.

Since the shift register which was described above can have circuits of the same structure which are used in respective stages thereof, in the same manner as in the conventional shift register shown in FIG. 8, it is possible to easily prepare a circuit layout to the desired number of shift pulses. Also, it is clear that the shift register of this invention can be realized by use of not only the TFT process but also the CMOS process which used single crystal silicon and the like.

[Embodiment 2]

Figure 3A:
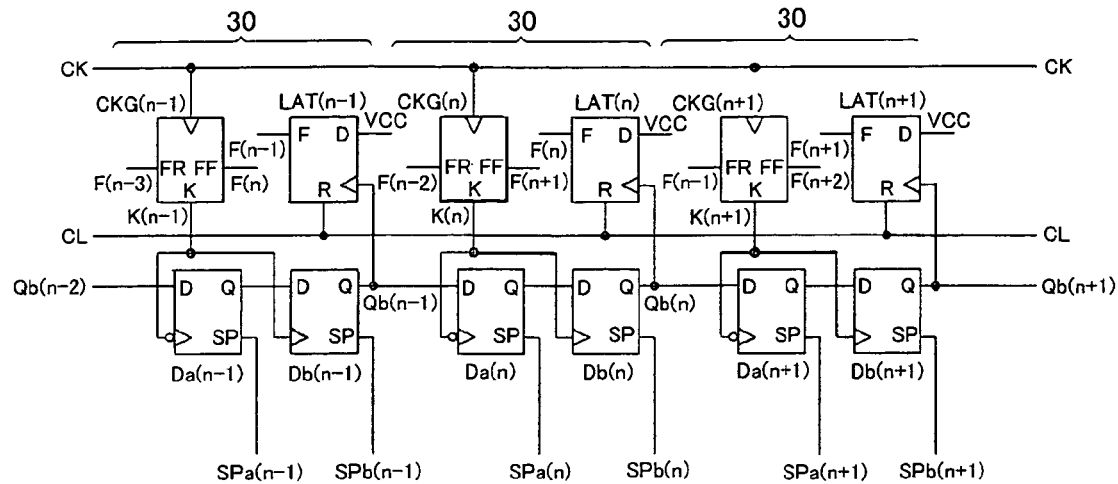
FIGS. 3A to 3C are views for showing another embodiment of a shift register of the invention.
Figure 3B:
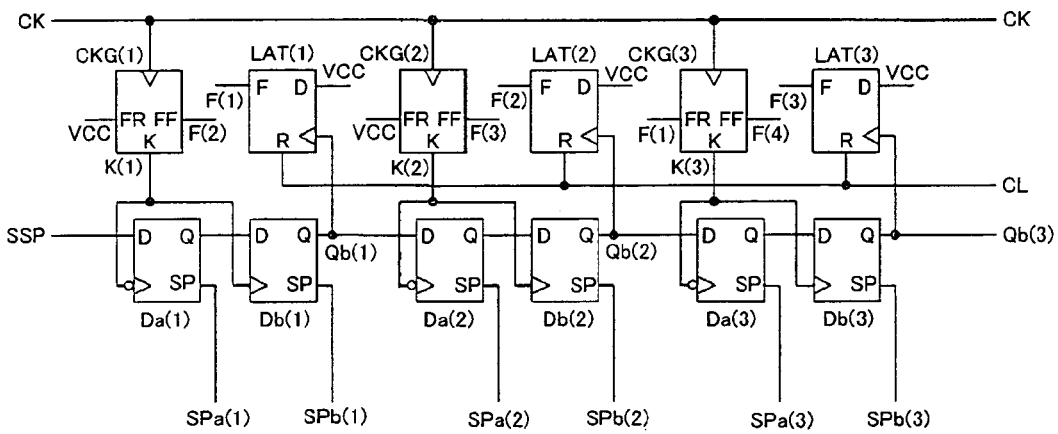
Figure 3C:
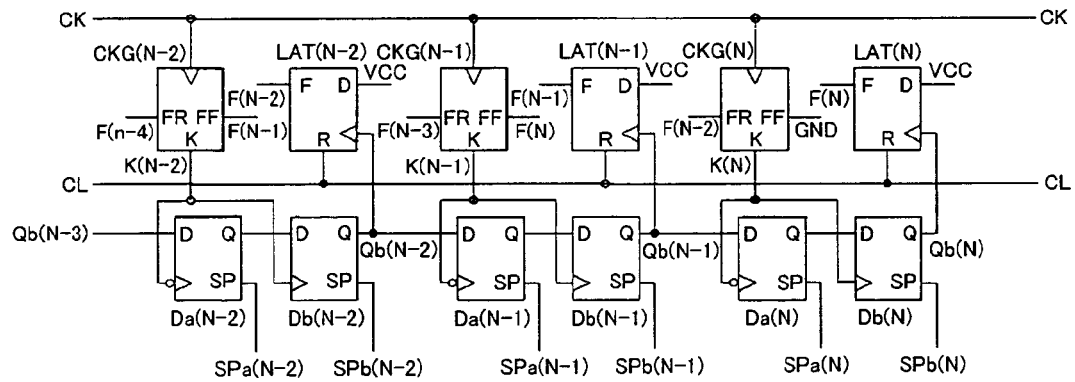

FIGS. 3A to 3C show another embodiment of a shift register of this invention, and in the same manner as in the conventional shift register of FIG. 8, it generates a group of 2N pieces of pulse signals. Unless otherwise noted, terminals, signals and the like with the same reference numerals and signs as in FIG. 1 represents ones which have the same operations and functions. In addition, in this embodiment, a pair of register circuits Da(n) and Db(n) correspond to the pulse generation portion, respectively.

<Intermediate Scanning Part>

FIG. 3A shows three units 30 of (n−1)th, (n)th and (n+1)th which were arranged arbitrarily in between.

The input clock signal CK is inputted to respective clock signal input terminals of the clock gate circuits CKG(n−1), CKG(n) and CKG(n+1).

From the extraction clock output terminal K of CKG(n−1), the clock signal K(n−1) is outputted and inputted to the extraction clock signal input terminals of the register circuit Da(n−1) and Db(n−1), and to the D input terminal D of Da(n−1), Qb(n−2), which is the Q output of Db(n−2) in a previous stage, is inputted, and Qa(n−1), which is the Q output of Da(n−1), is inputted to the D input of Db(n−1).

Since Da(n−1) is one which is operated by negative signals of K(n−1) and Db(n−1) is one which is operated by positive signals of K(n−1), in an 1 cycle of the clock, from the shift pulse outputs SP of Da(n−1) and Db(n−1), SPa(n−1) and SPb(n−1) are outputted. Qb(n−1), which is the Q output of Db(n−1), is also inputted to the clock input terminal of LAT(n−1) The D input of LAT(n−1) is connected to the power supply VCC, and the latch output F of LAT(n−1) is outputted as the status signal F(n−1).

From the extraction clock output K of CKG(n), K(n) is outputted, and inputted to the extraction clock signal input terminals of Da(n) and Db(n), and Qb(n−1), which is the Q output of Db(n−1) in an earlier stage, is inputted to the D input of Da(n), and Qa(n), which is the Q output of Da(n), is inputted to the D input of Db(n).

Since Da(n) is one which is operated by negative signals of K(n) and Db(n) is one which is operated by positive signals of K(n), in an 1 cycle of the clock, from the shift pulse outputs of Da(n) and Db(n), SPa(n) and SPb(n) are outputted. Qb(n), which is the Q output of Db(n), is also inputted to the clock input terminal of LAT(n). The D input of LAT(n) is connected to the power supply VCC, and the latch output F of LAT(n) is outputted as the status signal F(n).

From the extraction clock output K of CKG(n+1), K(n+1) is outputted, and inputted to the extraction clock signal input terminals of Da(n+1) and Db(n+1), and Qb(n), which is the Q output of Db(n) in an earlier stage, is inputted to the D input of Da(n+1), and Qa(n+1), which is the Q output of Da(n+1), is inputted to the D input of Db(n+1).

Since Da(n+1) is one which is operated by negative signals of K(n+1) and Db(n+1) is one which is operated by positive signals of K(n+1), in an 1 cycle of the clock, from the shift pulse outputs SP of Da(n+1) and Db(n+1), SPa(n+1) and SPb(n+1) are outputted. Qb(n+1), which is the Q output of Db(n+1), is also inputted to the clock input terminal of LAT(n+1). The D input of LAT(n+1) is connected to the power supply VCC, and the latch output F of LAT(n+1) is outputted as the status signal F(n+1).

To the FR input of CKG(n−1), F(n−3), which is the latch output of LAT(n−3) in a two earlier stage, is inputted, and to the FF input, F(n) is inputted. To the FR input of CKG(n), F(n−2), which is the latch output of LAT(n−2) in a two earlier stage, is inputted, and to the FF input, F(n+1) is inputted. To the FR input of CKG(n+1), F(n−1) is inputted, and to the FF input, F(n+2), which is the latch output of LAT(n+2) in a next stage, is inputted.

CKG(n−1), CKG(n) and CKG(n+1) are configured as shown in FIG. 7A.

LAT(n−1), LAT(n) and LAT(n+1) are configured as shown in FIG. 6.

Figure 5:
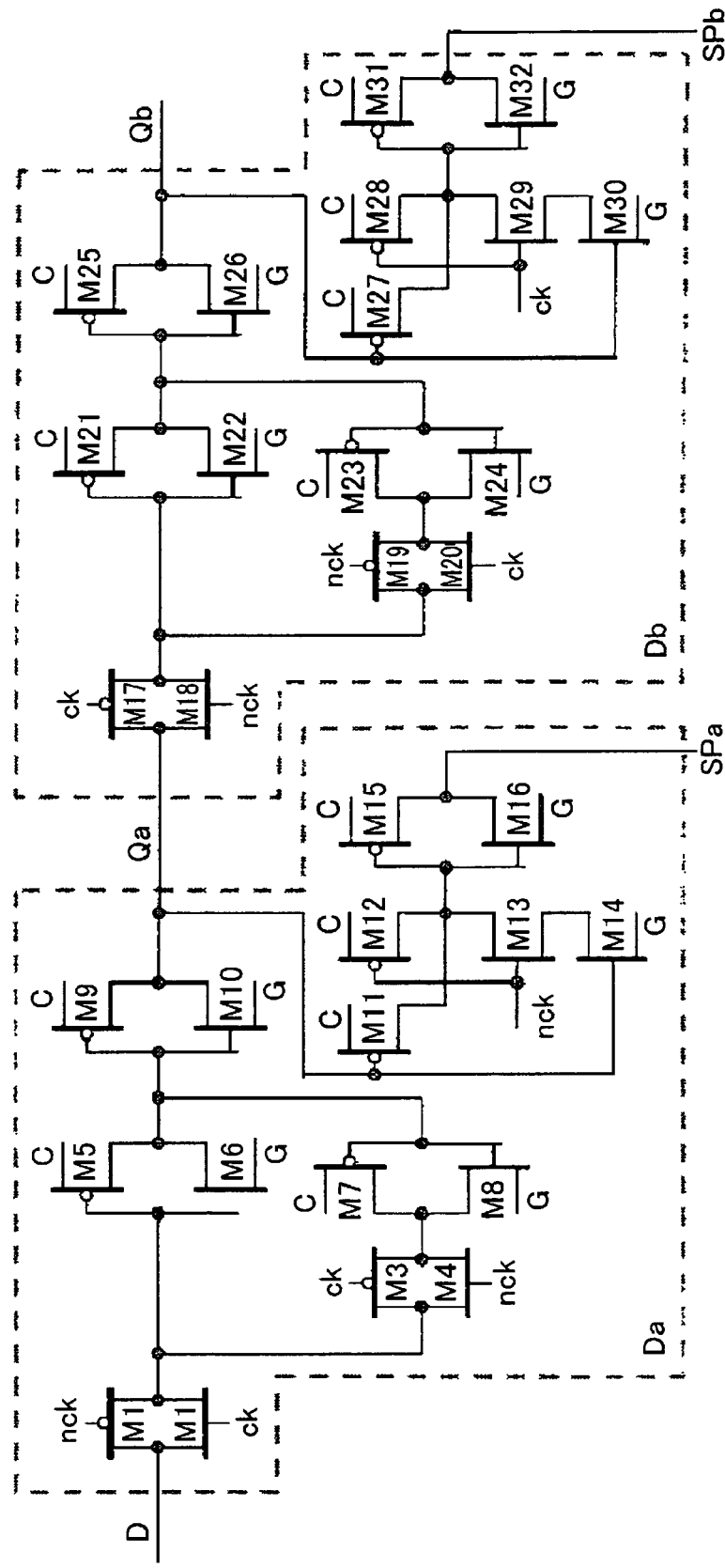
FIG. 5 is a circuit diagram of a shift register circuit which is used in the shift register shown in FIGS. 3A to 3C.

Three sets of register circuits of Da(n−1) and Db(n−1), Da(n) and Db(n), Da(n+1) and Db(n+1) are configured as shown in FIG. 5, and in the same manner as the DFF circuit shown in FIG. 10, it is a register circuit which includes two latch circuits which are configured by M1 to M10 and M17 to M26, and which is configured by two AND circuits of M11 to M16 outputting a shift pulse SPa by use of the latch output Qa and the negative clock nck as input and of M27 to M32 outputting a shift pulse SPb by use of the latch output Qb and the positive clock ck as input.

Qa is the latch output at ↑ timing of the input clock, and Qb is the latch output at ↓ timing of the input clock which is next generated. When a signal, which generates H level during only one period of H level of the input clock, is inputted to Qa, SPa is generated during a period of L level of the input clock, and SPb can generate a shift pulse which is generated during a period of H level of an next generated input. In order to equalize pulse widths of the shift pulses SPa and SPb, it is desirable that a duty ratio of the input clock is close to ½.

Operations of FIG. 3A will be described by use of a time chart of FIG. 4A.

Figure 4A:
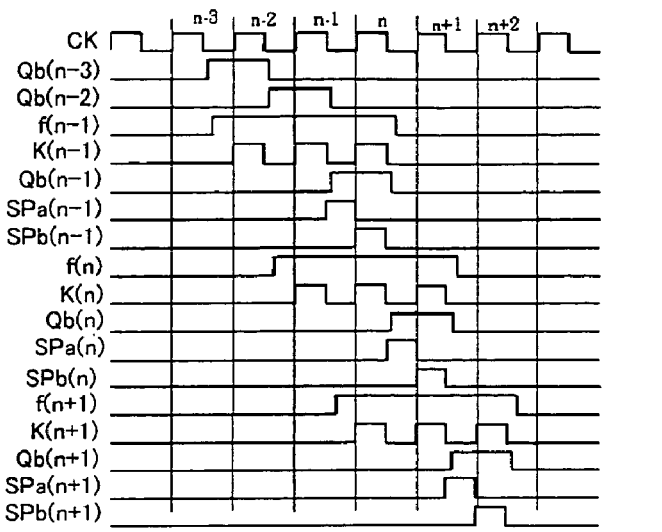
FIGS. 4A to 4C are time charts for explaining operations of the shift register shown in FIG. 3.

During a period that pulses are generated from the pulse generation means, the reset signal CL is in L level, and before the period shown in FIG. 4A, all LAT circuits are to be reset in advance. The input clock signal CK shows (n−3)th to (n+2)th clock cycle periods.

(n−3) Clock Period

It is assumed that, to the Q output of Da(n−1), as shown in the figure, Qb(n−2), which is in H level during a period of H level of the (n−2)th clock and which is the Q output of Db(n−2), is inputted.

Since f(n−1) in CKG(n−1), since F(n) is in L level, is changed to H level at a time point that F(n−3) is fixed to H level coming up with occurrence of Qb(n−3) so that K(n−1) is turned in the output status, but at this time, since CK is in L level, there is no clock output to K(n−1). Also, since F(n−2) and F(n−1) are in L level at this time, f(n) and f(n+1) are kept in L level, and both of K(n) and K(n+1) do not generate clock signals.

(n−2) Clock Period

At ↑ timing of K(n−2), Qa(n−2) is changed to H level, and at ↑ timing of a next clock, Qa(n−2) is changed to L level. Also, at ↓ timing of K(n−2), Qb(n−2) is changed to H level, and at next ↓ timing, Qb(n−2) is changed to L level. Qa(n−1) remains in L level, and SPa(n−1) and SPb(n−1) are not outputted. Since F(n−2) is changed to H level, coming up with occurrence of Qb(n−2), f(n) becomes H level and K(n) is turned in the output status, but since CK is in L level at this time point, K(n) is not generated.

(n−1) Clock Period

At ↑ timing of K(n−1), Qa(n−1) is changed to H level, and at ↑ timing of a next clock, Qa(n−1) is changed to L level. Also, at ↓ timing of K(n−1), Qb(n−1) is changed to H level, and at next ↓ timing, Qb(n−1) is changed to L level. On this account, SPa(n−1) is generated during a period of L level of K(n−1), and during a next period of H level, SPb(n−1) is generated. Since F(n−1) is changed to H level, coming up with occurrence of Qb(n−1), f(n+1) becomes H level and K(n+1) is turned in the output status, but since CK is in L level at this time point, K(n+1) is not generated.

(n) Clock Period

At ↑ timing of K(n), Qa(n) is changed to H level, and at ↑ timing of a next clock, Qa(n) is changed to L level. Also, at ↓ timing of K(n), Qb(n) is changed to H level, and at next ↓ timing, Qb(n) is changed to L level. On this account, SPa(n) is generated during a period of L level of K(n), and during a next period of H level, SPb(n) is generated. Since F(n) is changed to H level, coming up with occurrence of Qb(n), f(n−1) becomes L level and the output of K(n−1) is shut off.

(n+1) Clock Period

At ↑ timing of K(n+1), Qa(n+1) is changed to H level, and at ↑ timing of a next clock, Qa(n+1) is changed to L level. Also, at ↓ timing of K(n+1), Qb(n+1) is changed to H level, and at next ↓ timing, Qb(n+1) is changed to L level. On this account, SPa(n+1) is generated during a period of L level of K(n+1), and during a next period of H level, SPb(n+1) is generated. Since F(n+1) is changed to H level, coming up with occurrence of Qb(n+1), f(n) becomes L level and the output of K(n) is shut off.

(n+2) Clock Period

Since F(n+1) is changed to H level, coming up with occurrence of Qb(n+1), f(n) becomes L level and the output of K(n) is shut off.

Assumption of an input wave form of Qb(n−2) can be easily understood from generated wave forms of Qb(n−1), Qb(n) and Qb(n+1), if it is assumed that the same connection is carried out by use of Da(n−2), Db(n−2), LAT(n−2) and CKG(n−2) of the same structures. SPa(n−1), SPb(n−1) to SPa(n+1), and SPb(n+1) show the same desired shift pulse wave forms as in the shift register of FIG. 8. In this regard, however, in case of this embodiment, it is possible to generate two shift pulses in one cycle of the input clock CK.

<Start Scanning Part>

FIG. 3B shows a structure of a start scanning part, and it is of the same circuit structure as in FIG. 3A, but each FR input of CKG(1) and CKG(2) is connected to the power supply VCC. This relates to a fact that the first status of the status signal is the L (ground GND) status and the second status is the H (power supply VCC) status. That is, this is because, since the earlier shift pulse generation unit does not exist in at least the shift pulse generation unit which generates pulse signals in the first place out of the plurality of shift pulse generation units, instead of the status signal which is inputted from the earlier shift pulse generation unit than the corresponding shift pulse generation unit, it is desirable to input the same signal as the status signal of the second status. By this, it becomes possible to make all shift pulse generation units in the same circuit structure. To the FR and FF inputs of other respective CKG circuits, the status signal in two earlier stages and the status signal in a next stage are inputted, respectively.

Figure 4B:
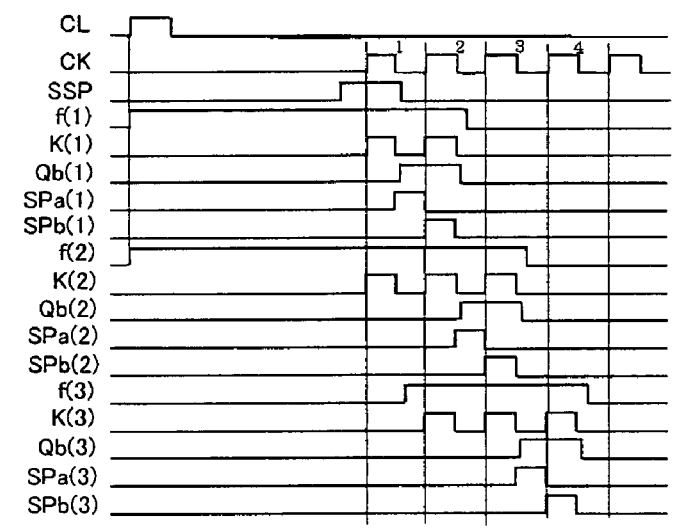

FIG. 4B is a time chart for explaining operations of FIG. 3B. The reset signal CL is in H level for a predetermined period prior to input of the 1st clock, and therefore, all LAT circuits are reset. Before the reset signal CL becomes H level, as can be seen from the description of FIG. 3A, all of the clock gate signals f(1), f(2) and f(3) are in L level.

When the reset signal CL becomes H level, all of the status signal F(1)~become L level, and therefore, f(1) and f(2) become H level to cause K(1) and K(2) to be able to output. However, until the input clock CK is inputted, clocks are not generated in K(1) and K(2). The scanning start signal SSP, which includes H level of the 1st clock CK and is shown in the figure, is inputted to the D input of Da(1). Coming up with first ↑ timing of K(1), Qa(1) becomes H level and coming up with next ↑ timing, Qa(1) becomes L level. Coming up with first ↓ timing of K(1), Qb(1) becomes H level and coming up with next ↓ timing, Qb(1) becomes L level. Coming up with this, SPa(1) and SPb(1) are generated. Since remaining operations are the same as the operations in FIG. 3A, description thereof will be omitted.

<End Scanning Part>

FIG. 3C shows a structure of the end scanning part, and it is of the same circuit structure as in FIG. 1A, but the FF input of CKG(N) is connected to the ground GND. In the same manner as in the start scanning part, this relates to a fact that the first status of the status signal is the L (ground GND) status and the second status is the H (power supply VCC) status. That is, this is because, since the later shift pulse generation unit does not exist in at least the shift pulse generation unit which generates pulse signals in the last place out of the plurality of shift pulse generation units, instead of the status signal which is inputted from the later shift pulse generation unit than the corresponding shift pulse generation unit, it is desirable to input the same signal as the status signal of the first status. By this, it becomes possible to make all shift pulse generation units in the same circuit structure. To the FR and FF inputs of other respective CKG circuits, the status signal in two earlier stages and the status signal in a next stage are inputted, respectively.

Since operations prior to the (N+1)th clock are the same as the operations of the intermediate scanning part, description thereof will be omitted. However, since the FF input of CKG(N) is in L level (GND ground), f(N) remains in H level continuously and it is possible for K(N) to output. However, since the clock CK is terminated at its (N+1)th one, after that, no clock is generated at K(N) After a predetermined time has passed since termination of the (N+1) th clock, since the reset signal becomes H level and the F(N−2) to F(N) become L level, a clock gate signal f(N) becomes L level to thereby shut off the output of K(N). After that, the reset signal CL is changed again to L level to thereby wait for the 1st clock, and from the 1st clock, operations of FIG. 4B will be carried out again.

The shift register which was described above and has the structures of FIGS. 3A to 3C can output a desired group of 2N pieces of shift pulse signals of SPa(1) and SPb(1) to SPb(N) and SPb(N) by inputting the clock CK, the scanning start signal SSP and the reset signal CL.

<Power Consumption of Shift Register of Embodiment 2>

In calculation of power consumption, in the same manner as in the conventional shift register of FIG. 8, power consumption of the MOS (Metal Oxide Semiconductor) circuit is generated by such an activity that a push-pull circuit, which is represented by an inverter and which comprises P type transistors and N type transistors, charges and discharges capacity which is added to this node. Capacity of the MOS circuit is mainly caused by channel capacity Cox which is generated between a gate oxide film and a channel. Here, simply, a switch circuit in which a gate is of low impedance (push-pull output) and an inverter circuit have the same load capacity Co.

Power consumption P10 of the clock system of the registers Da and Db is obtained by the following equation.

$P10=VCC^2 \times 6Co/To$

Power consumption P11 which is required for driving of D and Q systems of the registers Da and Db is obtained by the following equation, assuming that the number of pulses of a desired group of pulse signals is 2N.

$P11=VCC^2 \times 10Co/\{To \times (N+1)\}$

Power consumption P6 which is required for driving of the clock system of the CKG circuit shown in FIG. 7A is obtained by the following equation.

$P6=VCC^2 \times 3Co/To$

Power consumption P7 which is required for driving of the clock input is obtained by the following equation.

$P7=VCC^2 \times Co/To$

Power consumption P8 which is required for driving of FR and FF in the CKG circuit is obtained by the following equation.

$P8=VCC^2 \times 5Co/\{To \times (N+1)\}$

Power consumption P9 of the LAT circuit is obtained by the following equation.

$P9=VCC^2 \times 9Co/\{To \times (N+1)\}$

Considering the power consumption Pw3 of the shift register which is configured as shown in FIGS. 3A to 3C, three clocks are simply inputted to the DFF circuit as each register, two clocks are inputted to Da(1) and Db(1), and four clocks are inputted to Da(N) and Db(N), but here, simply, it is assumed that three clocks are inputted.

Figure 4C:
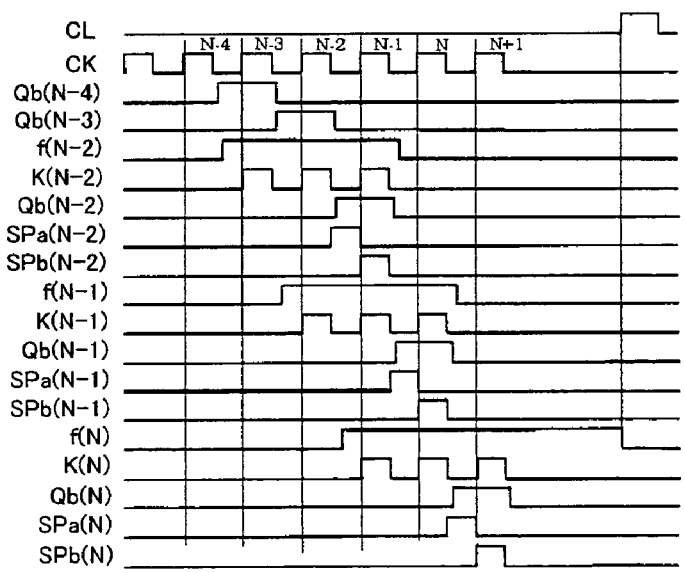

Also, as can be seen from the timing charts of FIGS. 4A to 4C, clocks are simultaneously inputted to three registers. In addition, considering the effective operation period K which shows a clock input period to an entire period, the power consumption Pw3 is obtained by the following equation (3).

$$Pw3=N \times [\{3 \times 3/(N+1)\} \times P10+P11+\{3 \times 3/(N+1)\} \times P6+P7+P8+P9] \times K \qquad (3)$$

For example, power consumption Pw3 of the horizontal scanning shift register 3 which is configured by a thin film transistor (TFT) circuit shown in FIG. 11 and used for a display panel of QVGA (320×240) is tried to be obtained by the equation (3), assuming N=320/2. Power consumption of the vertical scanning shift register 5 is likewise obtained by the equation (3), but since a vertical scanning clock cycle is more than 320 times larger than a horizontal scanning clock cycle, it can be neglected. Here, assuming that unit load capacity Co=50 fF of a switch and an inverter, power supply voltage VCC=10 v, effective operation period K=0.8, and the horizontal scanning clock cycle $T_0$=160 ns, $P10=0.188$ mW $P11=9.73\times10^{-4}$ mW $P6=9.38\times10^{-2}$ mW $P7=3.125\times10^{-2}$ mW $P8=4.87\times10^{-4}$ mW $P9=8.76\times10^{-4}$ mW $Pw3=160\times(1.05\times10^{-2}+9.73\times10^{-4}+5.24\times10^{-3}+3.125\times10^{-2}+4.87\times10^{-4}+8.76\times10^{-4})\times0.8$ mW $Pw3=6.3$ mW This means that the power consumption Pw1 of the conventional shift register of FIG. 8 shown by the equation (1)=48.1 mW is reduced to approximately 13% thereof.

The two shift registers of the embodiment 2 which was described above is not limited to the structures of FIGS. 3A to 3C. With regard to the status signal F(x) to be inputted to the forward status signal input terminal FR(n) and the status signal F(y) to be inputted to the rearward status signal input terminal FF(n), both of which are inputted to CKG(n) of an arbitrary integer stage n, if integers x and y satisfy the following relationship, it is possible to have it operated logically.

x<n; but, when x<1, the FR input is connected to the power supply VCC.

y>n; but, when y>N, the FF input is connected to the ground GND.

Since the shift register which was described above can have circuits of the same structure which are used in respective stages thereof, in the same manner as in the conventional shift register shown in FIG. 8, it is possible to easily prepare a circuit layout to the desired number of shift pulses. Also, it is clear that the shift register of this invention can be realized by use of not only the TFT process but also the CMOS process which used single crystal silicon and the like.

[Embodiment 3]

FIG. 7B shows a CKG circuit which can further reduce power consumption as compared to the CKG circuit of FIG. 7A which is used in the shift registers of the embodiments 1 and 2 which used this invention.

The clock signal input terminal CLK is inputted to an extraction switch which is configured by M9 and M10, and the other end of the extraction switch is connected to a reset switch which is configured by M11 between the other end of the switch and the ground GND, and inputted to a clock buffer circuit (clock output part) which comprises M12 to M15, and the positive clock ck and the negative clock nck are outputted.

Also, to M10/G, the positive clock gate signal f is connected, and to M9/G and M11/G, the negative clock gate signal Nf is connected. Since channel capacity Cox of a MOS transistor does not function as capacity when a channel is shut off, there remains only coupling capacitance which is smaller than the channel capacity Cox between a gate and a source (drain). On this account, capacity load, which is applied to the input clock CLK when M9/M10 are shut off, becomes small since a component of the channel capacity Cox does not exist.

In this manner, the clock signal input terminal for inputting the clock signals to each shift pulse generation unit is connected to one end of the extraction switch whose conduction and shut-off operations are controlled on the basis of a result of comparison of the status signals, and by inputting the clock signals to the pulse generation portion through the clock output part which was connected to the other end of the extraction switch, it becomes possible to reduce load capacity which is charged and discharged by many clock pulses which are inputted from the clock signal input terminal CLK, and it becomes possible to reduce power consumption more.

Also, as in this embodiment, if the other end of the extraction switch is inserted between it and reset potential of the extraction switch such as the ground GND (power supply potential VCC) and the like, and is connected to the reset switch which is turned in conduction and shut-off status in an opposite manner to the extraction switch, at the time of shut-off of the extraction, input to the clock output part can be kept to desired constant potential, and therefore, it is desirable.

Power consumption of the shift register of the embodiment 1 in case that the CKG circuit with the structure of FIG. 7B was used is tried to be calculated. In calculation of power consumption, in the same manner as in the conventional shift register of FIG. 8, power consumption of the MOS (Metal Oxide Semiconductor) circuit is generated by such an activity that a push-pull circuit, which is represented by an inverter and which comprises P type transistors and N type transistors, charges and discharges capacity which is added to this node. Capacity of the MOS circuit is mainly caused by channel capacity Cox which is generated between a gate oxide film and a channel. Here, simply, a switch circuit in which a gate is of low impedance (push-pull output) and an inverter circuit have the same load capacity Co.

<Power Consumption of Shift Register of Embodiment 3>

In calculation of power consumption, in the same manner as in the conventional shift register of FIG. 8, power consumption of the MOS (Metal Oxide Semiconductor) circuit is generated by such an activity that a push-pull circuit, which is represented by an inverter and which comprises P type transistors and N type transistors, charges and discharges capacity which is added to this node. Capacity of the MOS circuit is mainly caused by channel capacity Cox which is generated between a gate oxide film and a channel. Here, simply, a switch circuit in which a gate is of low impedance (push-pull output) and an inverter circuit have the same load capacity Co. Firstly, since the clock buffers M1 to M4 are removed from the DFF circuit of FIG. 10, power consumption P4 which is required for driving of the clock system of the DFF circuit is obtained by the following equation.

$P4=VCC^2\times 4Co/To$

Power consumption P5 which is required for driving of D and Q systems of the DFF circuit is obtained by the following equation, assuming that the number of pulses of a desired group of pulse signals is N.

$P5=VCC^2\times 7Co/\{To\times(N+1)\}$

Power consumption P6 which is required for driving of the clock system of the CKG circuit shown in FIG. 7B is obtained by the following equation.

$P6=VCC^2\times 3Co/To$

Assuming that load capacity of the input clock CLK when the switch which comprises M9 and M10 in the CKG circuit, is shut off, is load capacity cx, power consumption P12 which is required for driving of the clock input is obtained by the following equation.

$$P12=(VCC^2 \times Co/To) \times 3/(N+1)+(VCC^2 \times cx/To) \times (N-2)/(N+1)$$

Power consumption P8 which is required for driving of FR and FF in the CKG circuit is obtained by the following equation.

$$P8=VCC^2 \times 5Co/\{To \times (N+1)\}$$

Power consumption P9 of the LAT circuit is obtained by the following equation.

$$P9=VCC^2 \times 9Co/\{To \times (N+1)\}$$

Considering the power consumption Pw2 of the shift register which is configured in FIGS. 1A to 1C, four clocks are simply inputted to the DFF circuit as each register, and three clocks are inputted to a final stage of DFF(N), but here, simply, it is assumed that four clocks are inputted.

Also, as can be seen from the timing charts of FIGS. 2A to 2C, clocks are simultaneously inputted to three registers. In addition, considering the effective operation period K which shows a clock input period to an entire period, the power consumption Pw2 is obtained by the following equation (4).

$$Pw2=N \times [\{3 \times 4/(N+1)\} \times P4+P5+\{3 \times 4/(N+1)\} \times P6+P12+P8+P9] \times K \qquad (4)$$

For example, power consumption Pw2 of the horizontal scanning shift register 3 which is configured by a thin film transistor (TFT) circuit shown in FIG. 11 and used for a display panel of QVGA (320×240) is tried to be obtained by the equation (4). Power consumption of the vertical scanning shift register 5 is likewise obtained by the equation (4), but since a vertical scanning clock cycle is more than 320 times larger than a horizontal scanning clock cycle, it can be neglected. Here, assuming that load capacity $C_0$=50 fF, load capacity cx=5 fF, power supply voltage VCC=10 v, effective operation period K=0.8, and the horizontal scanning clock cycle $T_0$=160 ns, $P4=0.125$ mW $P5=6.81 \times 10^{-4}$ mW $P6=9.38 \times 10^{-2}$ mW $P12=3.38 \times 10^{-3}$ mW $P9=8.76 \times 10^{-4}$ mW $Pw2=320 \times (4.67 \times 10^{-3}+6.81 \times 10^{-4}+3.50 \times 10^{-3}+3.38 \times 10^{-3}+4.87 \times 10^{-4}+8.76 \times 10^{-4}) \times 0.8$ mW $Pw2=3.5$ mW This means that the power consumption Pw1 of the conventional shift register of FIG. 8 shown by the equation (1)=48.1 mW is reduced to approximately 7.2% thereof more considerably.

This means that power consumption P12 which is required for driving of the clock input CLK in this case was considerably reduced to approximately ⅕ as compared to the shift register of FIG. 8 and the power consumption P7 of the embodiment 1 and 2, and it is possible to considerably reduce the driving performance of the driving buffer of the clock CLK, and it is possible to realize not only reduction of circuit size but also stabilization of power supply, and it is possible to stabilize operations of the shift register. In addition, in case that the CKG circuit of FIG. 7B, which was explained in this embodiment, is used for the shift register of the embodiment 2, there are same advantages.

Next, a display panel to which this invention is preferably applicable will be described. Here, an EL panel of active matrix driving type, which used light emitting devices of current control type such as organic EL devices etc. which have been getting attentions in these years, is cited as an example. The suchlike EL device is applied to a panel type image display system (EL panel) in which pixel circuits which are configured by TFT were arranged in a two dimension manner, and the like. As a light emission setting system of this EL device, a voltage setting system and a current setting system have been used well.

<EL Panel by Use of Voltage Setting System>

Figure 18:
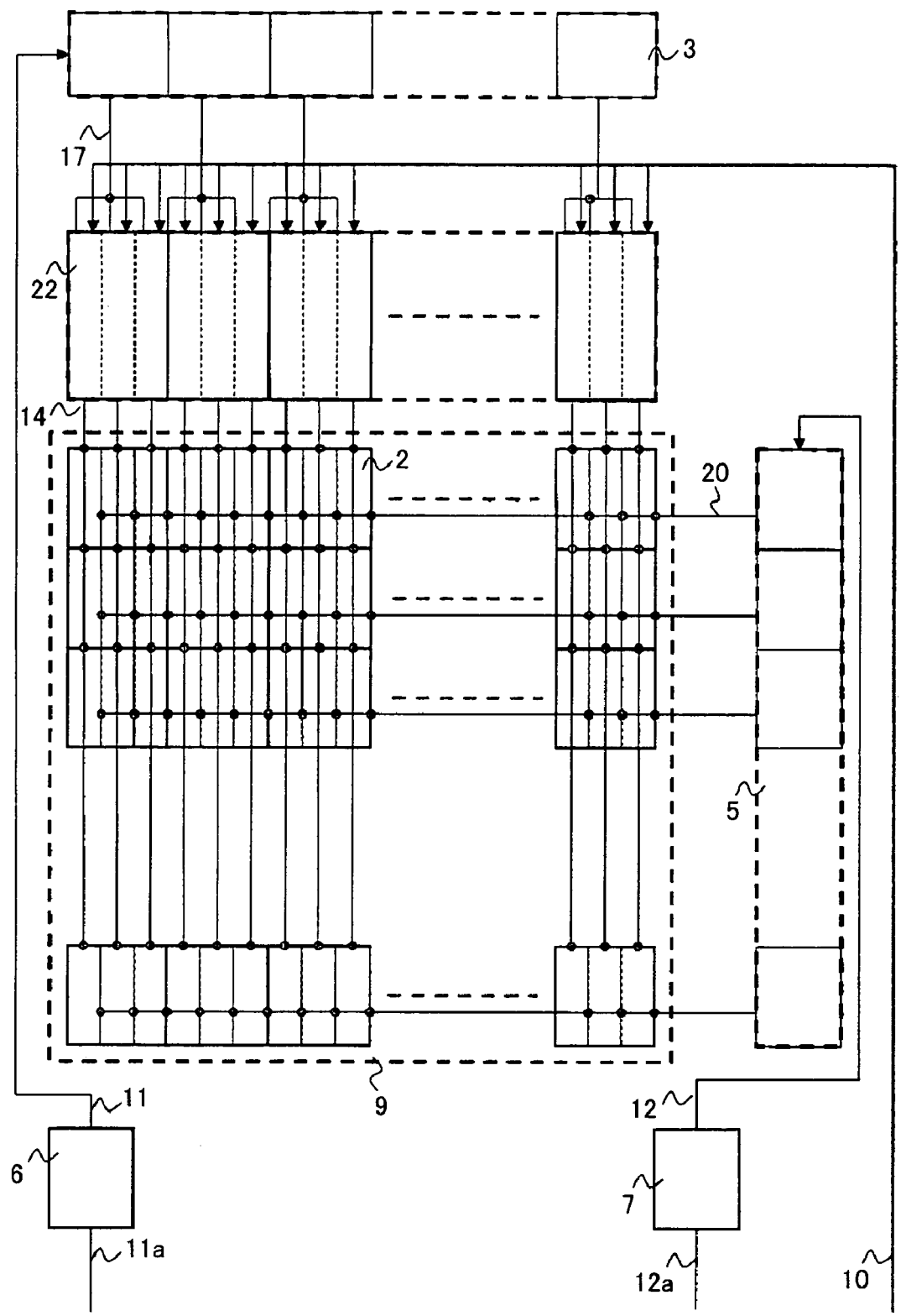
FIG. 18 is a circuit diagram of an entire circuit of an EL panel with a voltage setting system.

A circuit structure of an EL panel colorized by use of the voltage setting system is shown in FIG. 18.

An input video signal 10 is properly inputted to row control circuits 22 which comprises circuits three times more than the number of horizontal pixels of the EL panel which are disposed with respect to each color of RGB. Also, a horizontal scanning control signal 11a is inputted to an input circuit 6, a horizontal scanning control signal 11 is output, and the horizontal scanning control signal 11 is inputted to a horizontal shift register 3 which comprises shift registers, the number of which is the same as the number of horizontal pixels. The horizontal scanning control signal 11 comprises a horizontal clock signal and a horizontal scanning start signal. And, a group of horizontal sampling signals 17 which are outputted from each terminal of the horizontal shift register are inputted to the row control circuits 22 that each takes charge.

Figure 20:
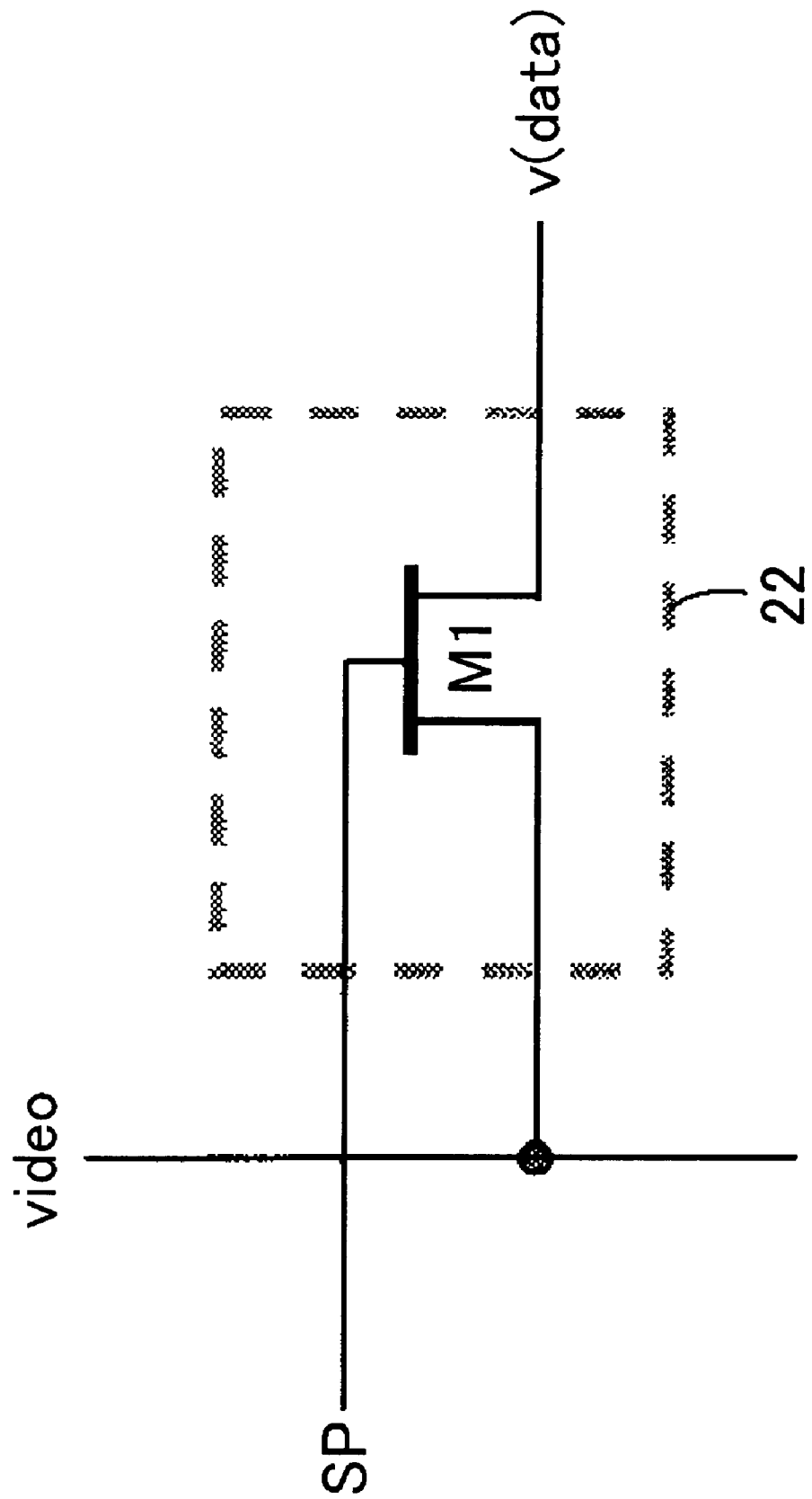
FIG. 20 is a circuit diagram of a column control circuit with the voltage setting system.

A structure of the row control circuits 22 is of such a very simple structure that, as shown in FIG. 20, the horizontal sampling signal (pulse signal) SP is connected to M1/G, and an input video signal video (here, one of RGB) is connected to M1/S, and image voltage data v(data), which is a column control signal 14, is outputted to M1/D.

In addition, in this specification, a gate electrode, a source electrode, and a drain electrode of a transistor are shown by abbreviated codes of /G, /S, and /D. In this regard, however, a connection configuration which was shown here is simply one example, and in case that a relation of electric potential between two power supply potentials GND and VCC and a channel characteristic of each transistor were reversed and the like, the structure may be changed properly in response to that. Also, the transistor which was indicated by Mi (i is natural number) in the figure may be not only TFT but also an insulated gate type field effect transistor which used single crystal silicon.

In an image display region 9, pixel circuits 2 each of which has the same structure are arranged in a two dimensional manner, and each takes charge of driving of EL display devices of RGB, and a pair of three pixel circuits 2 take charge of display of one pixel.

The image voltage data v(data) which is outputted from the row control circuits 22 is inputted to a group of pixel circuits 2 which were arranged in the same row. Also, a vertical scanning control signal 12a is outputted through an input circuit 7 as a vertical scanning control signal 12, and the vertical scanning control signal 12 is inputted to a vertical shift register 5 which includes shift registers, the number of which is the same as the number of vertical pixels of the EL panel. This vertical scanning control signal 12 comprises a vertical clock signal and a vertical scanning start signal. And, row control signals 20 which are outputted from each output terminal of the vertical shift register are inputted to the pixel circuits 2 which are arranged in the same row.

[Pixel circuit with Voltage Setting System]

Figure 19:
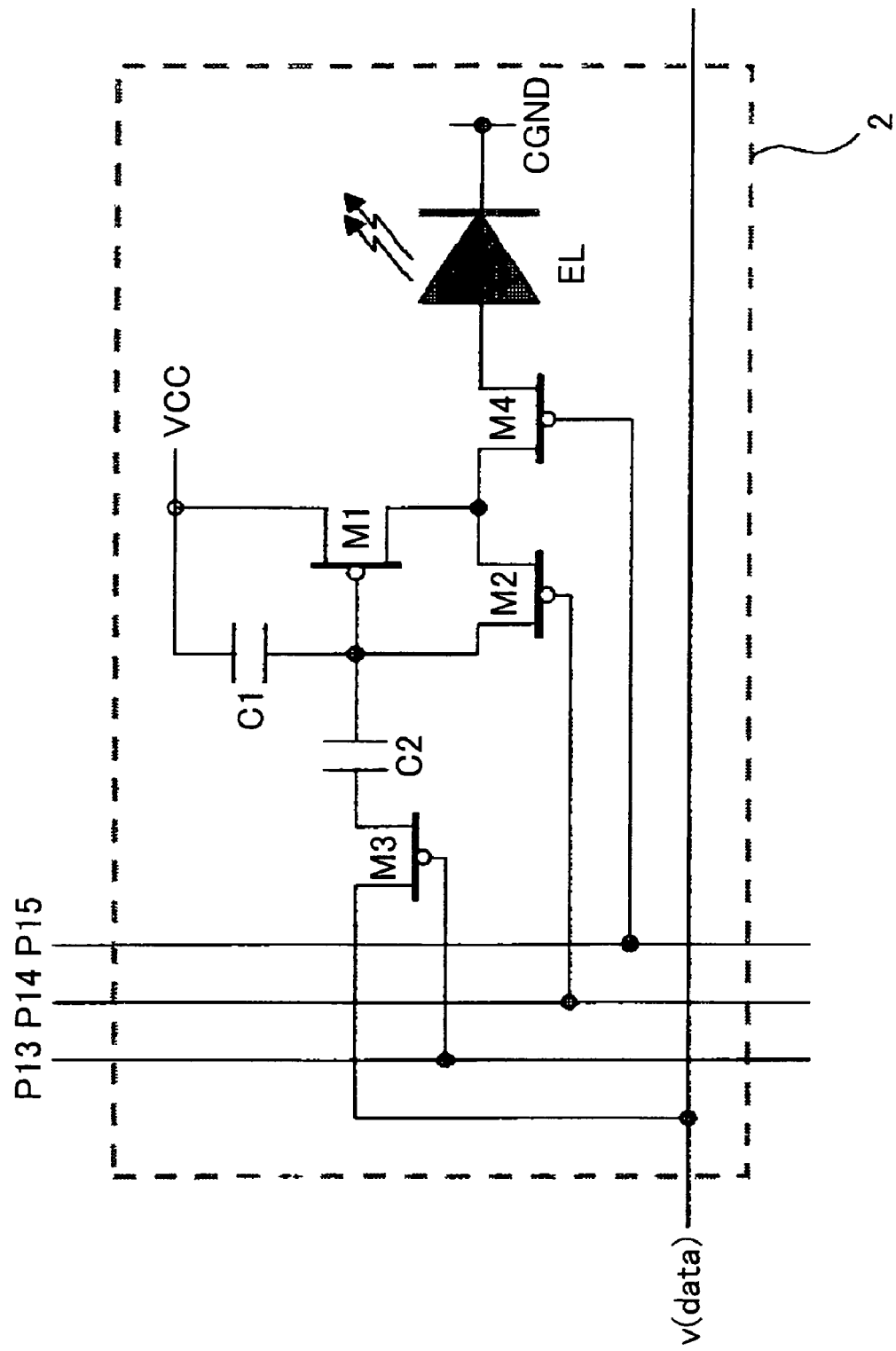
FIG. 19 is a circuit diagram of a pixel circuit with the voltage setting system.

A structure of the pixel circuit 2 of the voltage setting system is shown in FIG. 19.

The voltage data v(data) is connected to M3/S. Also, the row control signal 20 corresponds to P13, P14, and P15, P13, P14, and P15 are connected to M3/G, M2/G, M4/G respectively. M3/D in connected to a capacity C2 and a capacity C2 is connected to M1/G whose source was connected to the power supply and a capacitance C1. And, M1/D and M1/G are connected to M2/D and M2/S, respectively, and M1/D is connected to M4/S, and M4/D is connected to a current injection terminal of the EL device, one end of which was grounded.

Next, operations of the EL panel of FIG. 18 will be described by use of a time chart of FIG. 21. In FIG. 21, FIG. 21A shows the input video signal video, and FIG. 21B shows the horizontal sampling signal SP, and FIG. 21C to FIG. 21E show the row control signals P13 to P15 of the corresponding row. In addition, in FIG. 15, three horizontal periods, in sum, three row periods are shown.

Firstly, at time t1 to t2 within a horizontal blanking period of the input video signal, each horizontal sampling pulse SP is changed to H level all at once, and at this time, blanking voltage which is the input video signal is made to be the column control signal 14. In addition, In SP of FIG. 21B, the horizontal sampling signal in the corresponding column is shown by a solid line.

Before Time t5 (Light Emission Holding Period)

At time t1 to t5, row control signals P13 to P15 of the pixel circuits 2 in the corresponding row are in H level, H level, and L level, respectively, and at time t1 to t2, even if each horizontal sampling pulse is changed to H level all at once, M2, M3, and M4 of the corresponding pixel circuit 2 are kept in OFF, OFF, and ON, and therefore, drain current of M1, which is determined by the capacitance C1 and M1/G voltage of the corresponding pixel circuit 2 which is holding voltage of a gate capacitance of M1, is injected into the corresponding EL device so that light emission is continued. In addition, at time t1 to t2 within the horizontal blanking period, voltage of the input video signal video is, as shown in FIG. 21, voltage Vb1 which is close to black level.

Time t5 to t9 (Light Emission Setting Period)

At time t5, the row control signals P13 and P15 in the corresponding row are changed to L level and H level. At time t5 to t6, each horizontal sampling pulse SP is again changed to H level all at once, and at this time, the blanking voltage which is the input video signal is made to be the column control signal 14.

At this time, in the pixel circuit 2 shown in FIG. 19 in the corresponding row, since M4 is turned OFF and current supply to the corresponding EL device disappears, the corresponding EL device is blacked out. Also, since M2 and M3 are in ON and ON statuses respectively, the capacitance C1, C2 and the gate capacitance of M1 are discharged in such a manner that (VCC−M1/G) voltage comes gradually close to a threshold voltage Vth of M1, and therefore, drain current of M1 is reset to a very small value. In addition, also at t5 to t6 within the horizontal blanking period, voltage of the input video signal video is, as shown in FIG. 21, voltage Vb1 which is close to black level in the same manner as at t1 to t2.

At time t6, SP and P14 become L level and H level, respectively, but (VCC−M1/G) voltage of the corresponding pixel circuit 2 is the threshold voltage Vth of M1 continuously.

At time t7 to t8, SP in the corresponding column becomes H level, and a value d2 of the input video signal at this time is inputted to the corresponding pixel circuit 2 as v(data). At this time, M1/G voltage of the corresponding pixel circuit 2 is changed in voltage only by voltage ΔV. The voltage ΔV is roughly shown by an equation (5).

$$\Delta V = -d2 \times C2 / \{C2 + C1 + C(M1)\} \quad (5)$$

Here, C(M1) represents gate input capacitance of M1 in the corresponding pixel circuit 2.

At time t8, SP is changed again to L level, and change of M1/G voltage which is shown by the equation (5) is held, and this status is held until time t9.

After Time t9 (Light Emission Holding Period)

At time t9, P13 and P15 are changed again to H level and L level, and M3 and M4 of the corresponding pixel circuit 2 are turned in OFF and ON statuses. The drain current of M1, which is defined by M1/G voltage of the corresponding pixel circuit which was changed in this manner, is injected into the corresponding EL device, and there occurs change of light emission amount, and this status is held.

At time t9 to t10 and at time t11 to t12, the corresponding SP signal is changed to H level, but since M3 of the corresponding pixel circuit 2 is OFF, it does not affect to light emission operations of the corresponding EL device.

The equation (5) means that the light emission amount can be set by voltage value (d2) which is based on Vb1 during the horizontal blanking period of the input video signal video. The drain current Id of M1 of the pixel circuit 2 can be roughly shown by an equation (6).

$$Id = \beta \times \Delta V^2 \quad (6)$$

Since the EL device basically carries out the light emission operation in proportion to injected current, in the EL panel of the voltage setting system shown in FIG. 18, it can be seen from the equation (6) that the light emission amount of the EL device of each pixel can be controlled by a value which was in proportion to square of input video signal level which is based upon blanking voltage. A circuit structure of a time proven liquid crystal panel can be diverted for the EL panel of the voltage setting system except for the pixel circuits 2.

<EL Panel by Use of Current Setting System>

A circuit structure of an EL panel colorized by use of the current setting system is shown in FIG. 11. Firstly, a difference with the EL panel by use of the voltage setting system in FIG. 18 will be described.

An auxiliary column control signal 13a outputs an auxiliary column control signal 13 through an input circuit 8, and the auxiliary column control signal 13 is inputted to gate circuits 4 and 16. Also, a group of horizontal sampling signals 17 which are outputted to each terminal of the horizontal shift register 3 are inputted to a gate circuit 15, and a group of converted horizontal sampling signals 18 are inputted to a column control circuits 1. To the gate circuit 15, a control signal 21 which is outputted from a gate circuit 16 is inputted. To the column control circuits 1, a control signal 19 which is outputted from the gate circuit 4 is inputted.

[Column Control Circuit]

Figure 14:
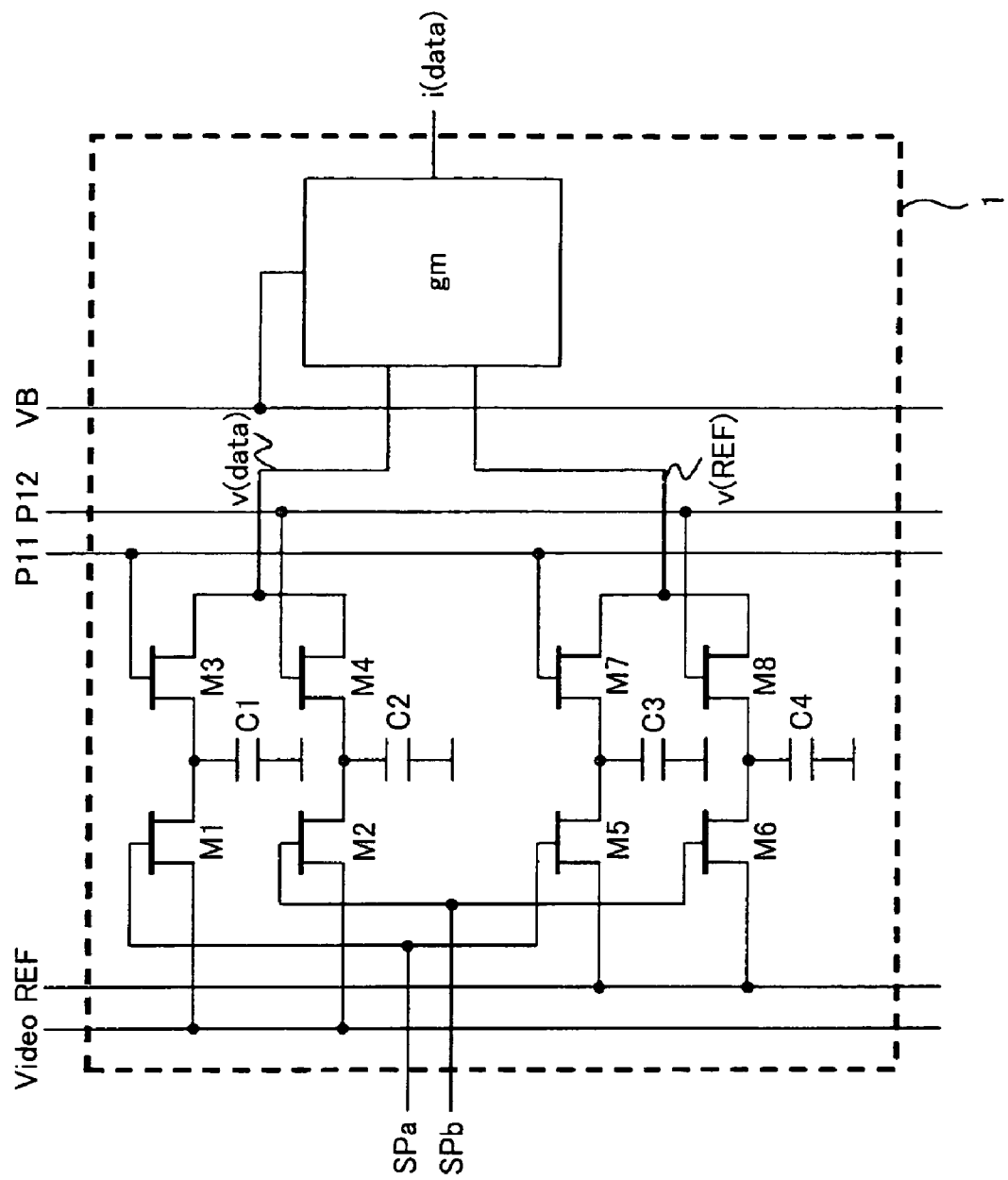
FIG. 14 is a circuit diagram of an EL device drive control circuit (column control circuit) with a current setting system.

A structure of column control circuits 1, which comprise circuits, the number of which is the same as the number of horizontal pixels of the EL panel of the current setting system, is shown in FIG. 14.

Input video information is the input video signal video and a reference signal REF, and they are inputted to M1/S, M2/S and M5/S, M6/S, respectively. Also, a group of horizontal sampling signals 18 which are outputted from the gate circuit 15 comprise SPa and SPb, respectively, and connected to M1/G, M5/G and M2/G, M6/G of the column control circuit 1. And, to M1/D, M2/D, M5/D, and M6/D, capacitance C1, C2, C3 and C4 are connected respectively, and M3/S, M4/S, M7/S, and M8/S are connected. The control signal 19 is P11 and P12, and they are connected to M3/G, M7/G, and M4/G, M8/G respectively. M3/D and M4/D, M7/D and M8/D are connected to each other, and inputted to a voltage-current conversion circuit gm as v(data) and v(REF). Also, to the voltage-current conversion circuit gm, reference current setting bias VB is inputted and it outputs current signals i(data) which are used as the column control signal 14.

Figure 16A:
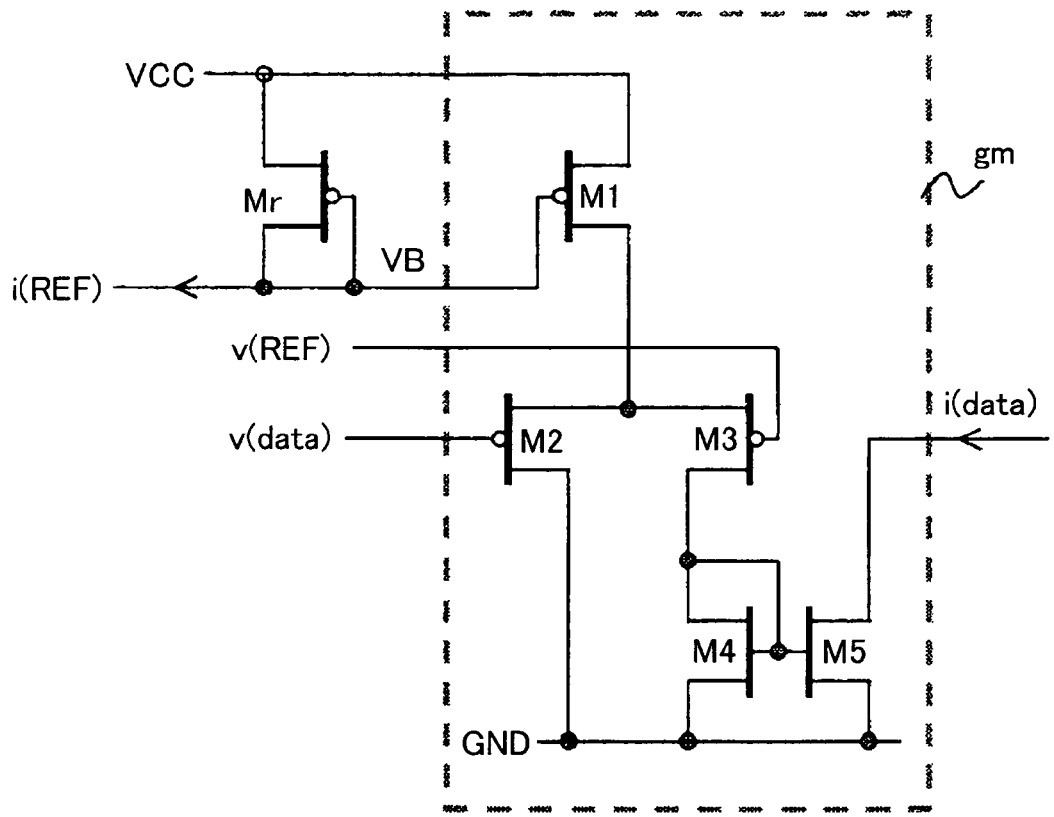
FIGS. 16A and 16B are views for explaining a voltage-current conversion circuit which is used in the EL device drive control circuit shown in FIG. 14.

An example of a structure of the voltage-current conversion circuit is shown in FIG. 16A. Since basic operations thereof are common, description thereof will be omitted, but a point to keep in mind is that, assuming a 200 ppi EL panel as one example in an EL panel which aims power saving, injection current to the EL device of each pixel is small, and maximum current is assumed to be 100 nA which is considerably lower than 1 μA. Under this condition, in order to obtain a linear voltage-current conversion characteristic to the greatest extent possible, there is a necessity to lessen a W/L ratio of a gate regions of M2 and M3 and to lessen current driving performance.

Figure 16B:
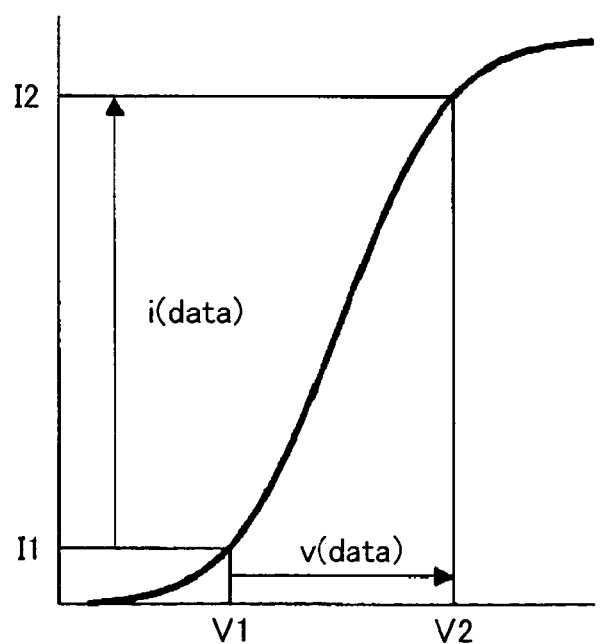

FIG. 16B shows a voltage-current conversion characteristic of FIG. 16A. In the voltage-current conversion circuit of FIG. 16A, it is difficult to make such a design that minimum current I1 (black current) in minimum voltage V1 (black level) is made to be zero current. If the black current I1 can not be made to zero current, it becomes impossible to ensure contrast which is important as an image display panel.

Figure 17A:
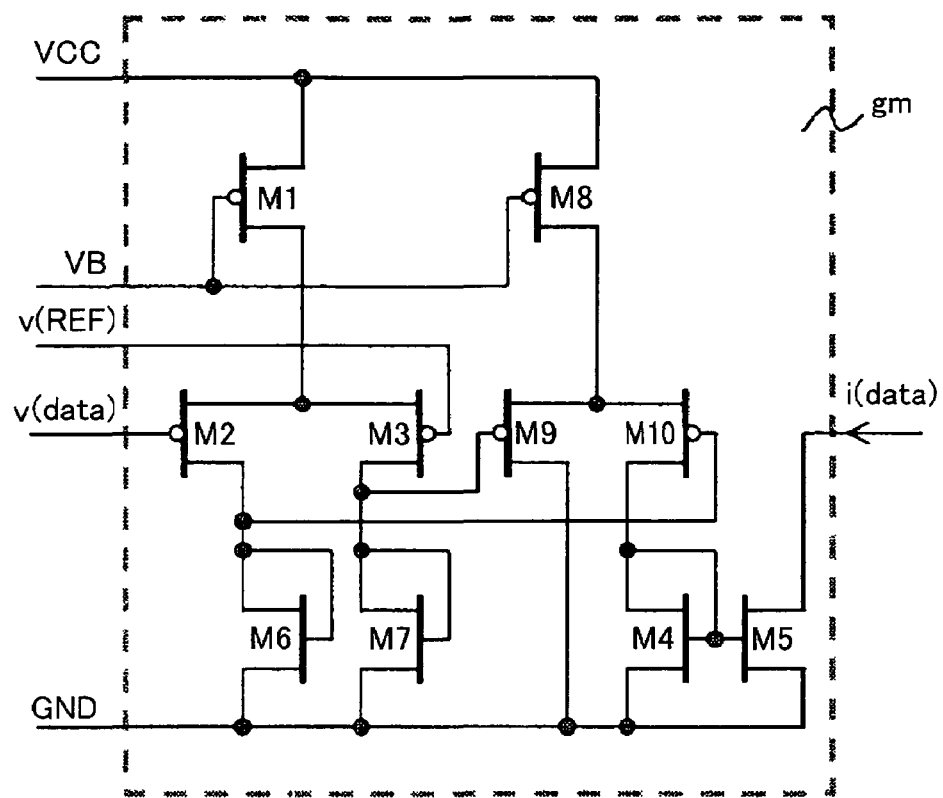
FIGS. 17A and 17B are views for explaining another voltage-current conversion circuit which is used in the EL device drive control circuit shown in FIG. 14.

An example of a structure of the voltage-current conversion circuit to which some countermeasures were applied with regard to this point is shown in FIG. 17A. To each drain terminal of a first source couple circuits M2 and M3, M6 and M7 in which a source was grounded, and a drain and a gate was short-circuited are connected. Furthermore, provided is M8 which is operated as a second reference current source in which a source was connected to the power supply and a gate was connected to the reference current bias VB, and M8/D is connected to a second source couple circuits M9 and M10, and M9/G and M10/G are connected to M7/D and M6/D, respectively. And, from M10/D, in the same manner as the voltage-current conversion circuit of FIG. 16A, the current signal i(data), which becomes the column control signal 14, is outputted through a current mirror circuit of M4 and M5. In FIG. 17A, in order to make the current driving performance of M6 and M7 smaller than M9 and M10, the W/L ratio of the gate regions of M6 and M7 is made smaller than the W/L ratio of the gate regions of M9 and M10.

Figure 17B:
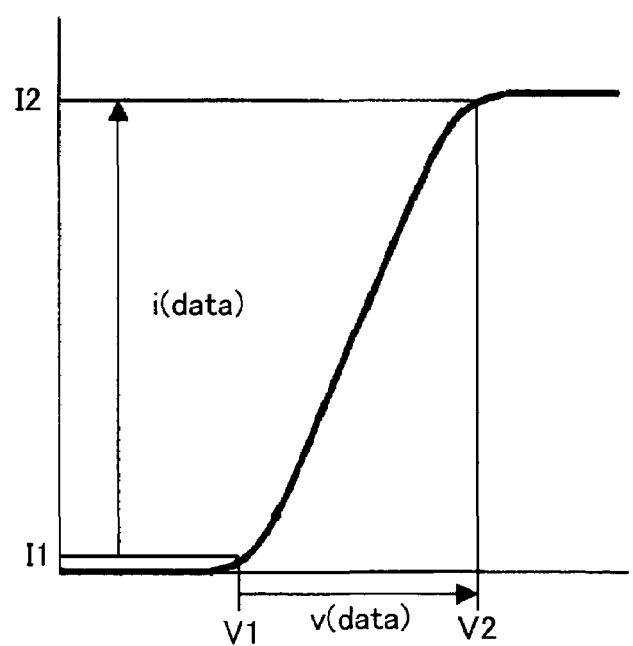

A voltage-current conversion characteristic of the voltage-current conversion circuit of FIG. 17A which was designed in this manner is shown in FIG. 17B. It is possible to lessen the black current I1 at the black level V1, and it is possible to realize linearity of the voltage-current conversion characteristic without destroying the linearity.

Operations of the column control circuit 1 will be described by use of a time chart of FIG. 15.

At time t1, the control signals P11 and P12 are changed to L level and H level, respectively.

During an effective period of the input video signal at time t1 to t4, a group of horizontal sampling signals SPa is generated. At this time, t1 to t3, SPa of the corresponding column is generated, and by sampling video and REF at this time point to the capacitance C1 and C3, it is held after time t3.

At time t4, the control signals P11 and P12 are changed to H level and L level, respectively, and (v(data)−v(REF)), which is inputted to the voltage-current conversion circuit, becomes d1 and on the basis of the video information which was taken in at time t2 to t3, the current signal i(data) is outputted as the column control signal 14 during a period of t4 to t7.

During the effective period of the input video signal at time t4 to t7, a group of horizontal sampling signals SPb is generated, at time t5 to t6, SPb of the corresponding column is generated, and video and REF at this time point are sampled to the capacitance C2 and C4, and it is held after time t6.

At time t7, the control signals P11 and P12 are changed again to L level and H level respectively, and (v(data)−v(REF)), which is inputted to the voltage-current conversion circuit gm, becomes d2 and on the basis of the video information which was taken in at time t5 to t6, the current signal i(data) is outputted as the column control signal 14 during one horizontal scanning period from time t7.

During the effective period of the input video signal during one horizontal scanning period from time t7, the group of horizontal sampling signals SPa is again generated, and SPa in the corresponding column is generated at time t8 to t9, and input video and REF at this time point are sampled to the capacitance C2 and C4, and it is held after time t9.

By repeating the above-described operations, the current signal i(data), which is the column control signal 14, is converted into a line sequential signal which is renewed with respect to each horizontal scanning cycle of the input video signal video.

[Pixel Circuit with Current Setting System]

Figure 13A:
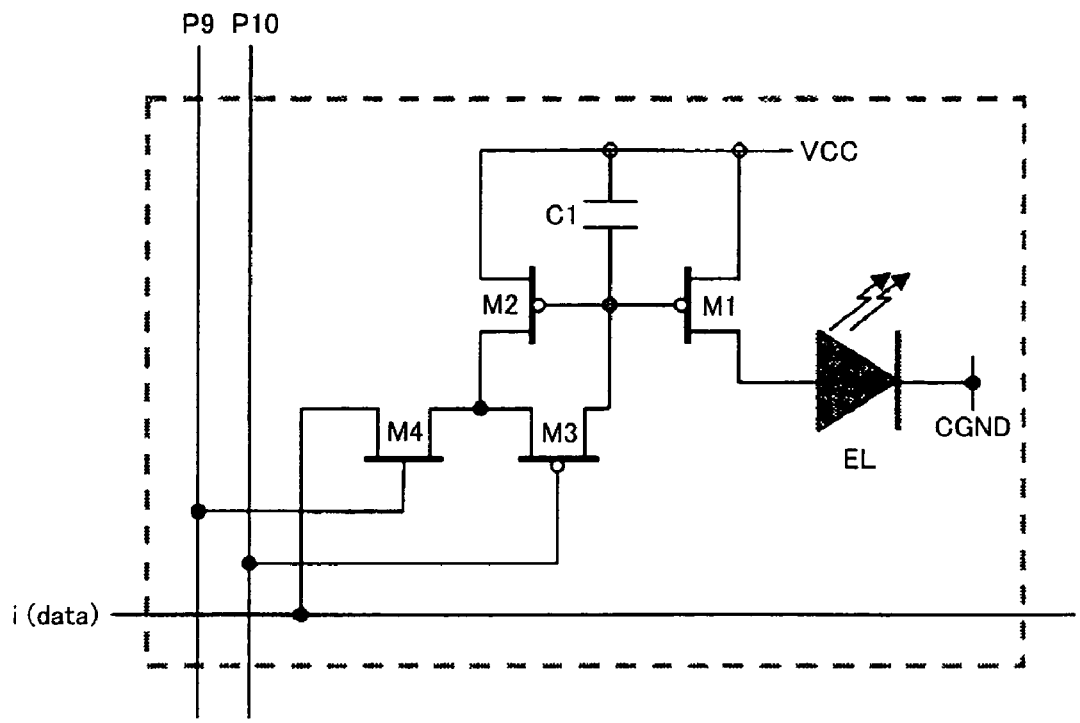
FIGS. 13A and 13B are views for explaining a pixel circuit with the current setting system.
Figure 13B:
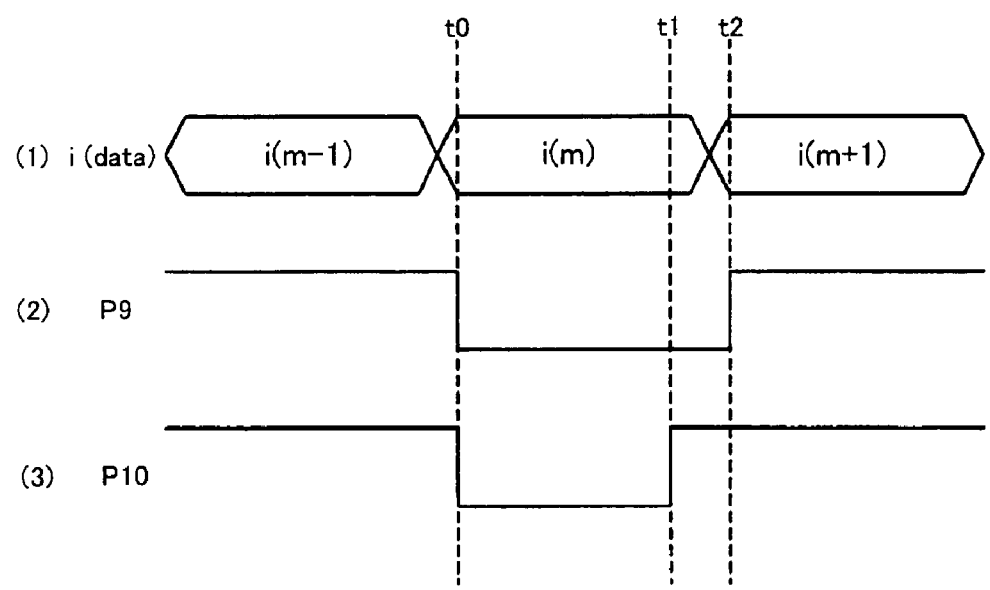

FIGS. 13A and 13B are views for explaining the pixel circuit with the current setting system. FIG. 13A is a circuit diagram of the pixel circuit with the current setting system. FIG. 13B is a time chart for explaining operations of the pixel circuit of FIG. 13A. P9 and P10 correspond to the row control signal 20, and the current i(data) is inputted as the column control signal 14, and M1/D is connected to the current injection terminal of the EL device which was grounded.

Operations will be described by use of a time chart of FIG. 13B. Before time to, since P9 and P10 in the corresponding m row are in H level, both M3 and M4 are OFF, and by the M1/G voltage which was determined by charge voltage which was held in the capacitance C1 and the gate capacitance of M1, current is injected to the EL device, and in response to this, the corresponding EL device is emitting light.

At time t0, both P9 and P10 in the corresponding row are changed to L level and a current signal i(m) at a (m)th line is fixed. That is, in order that both M3 and M4 are turned ON, the current signal i(m) is supplied to M2, and in response to this, M2/G voltage is set, and the capacitance C1 and the gate capacitance of M1 and M2 are charged, and a current, which corresponds to the current signal i(m), starts to be injected to the corresponding EL device.

At time t1 that the current signal i(m) is fixed, P10 is changed to H level and M3 is turned in the OFF status, and a setting operation of the M2/G voltage is completed, and it goes to a holding operation. At time t2, P9 is also changed to H level and the current supply to M2 is stopped, but the M2/G voltage which was set by the current signal i(m) is kept as it is held, and by injected current which was set again, the corresponding EL device is set again and the emission of light is continued.

Figure 12A:
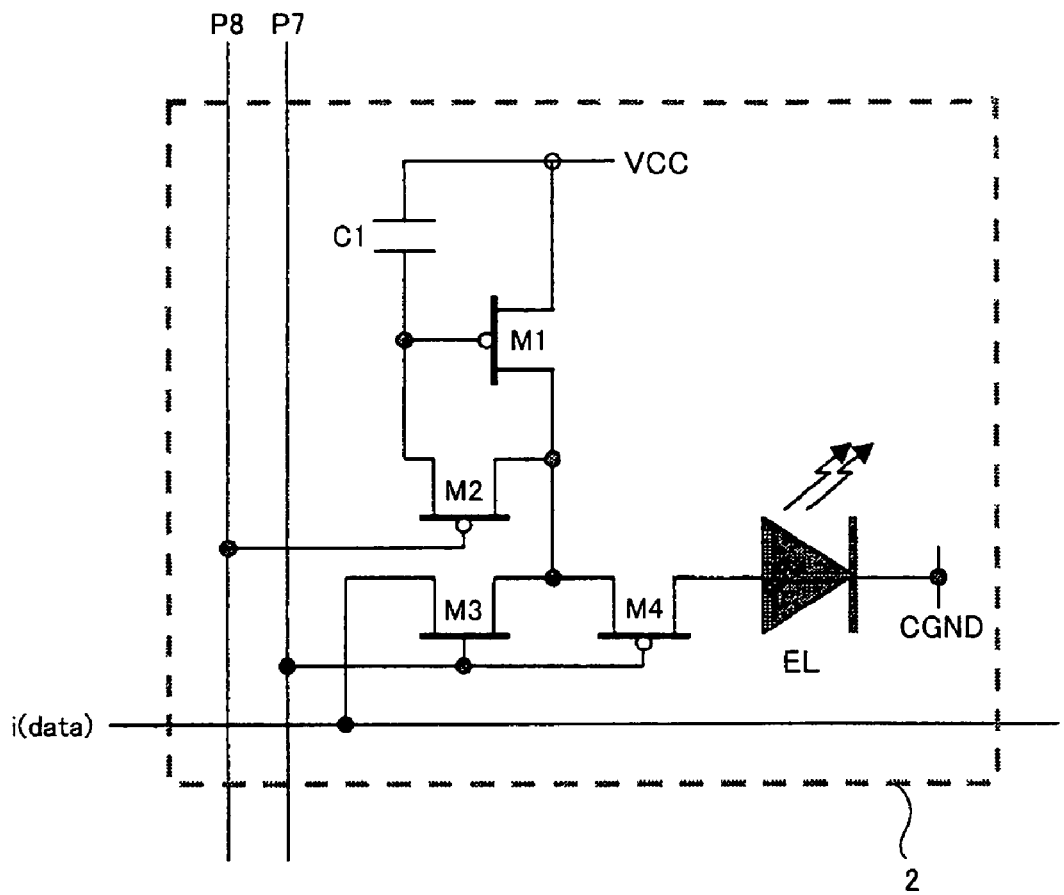
FIGS. 12A and 12B are views for explaining a pixel circuit with the current setting system.
Figure 12B:
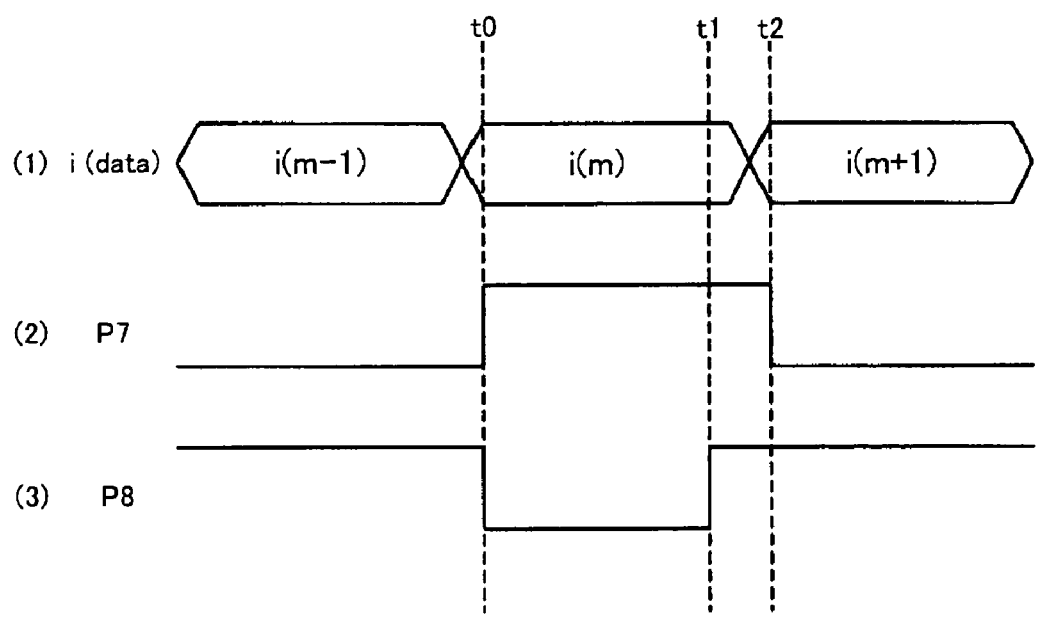

FIGS. 12A and 12B are views for explaining the pixel circuit with the current setting system. FIG. 12A is a circuit diagram of the pixel circuit with the current setting system. FIG. 12B is a time chart for explaining operations of the pixel circuit of FIG. 12A. P7 and P8 correspond to the row control signal 20, and the current i(data) is inputted as the column control signal 14, and M4/D is connected to the current injection terminal of the EL device which was grounded.

Operations will be described by use of a time chart of FIG. 12B. Before time t0, since P7 and P8 in the corresponding m row are in L level and H level respectively, both M2 and M3 are OFF and M4 is ON, and by the M1/G voltage which was determined by charge voltage which was held in the capacitance C1 and the gate capacitance of M1, current is injected to the EL device, and in response to this, the corresponding EL device is emitting light.

At time t0, both P7 and P8 in the corresponding row are changed to H level and L level respectively, and a current signal i(m) at the (m)th line is fixed. In order that both M2 and M3 are turned ON and M4 is turned OFF, the current supply to the EL device in the corresponding row is stopped so that the EL device in the corresponding row is turned off. Furthermore, since the current signal i(m) is supplied to M1, in response to this, M1/G voltage is set, and the capacitance C1 and the gate capacitance of M1 are charged.

At time t1 that the current signal i(m) is fixed, P8 is changed again to H level and M2 is turned in the OFF status, and a setting operation of the M1/G voltage is completed, and it goes to a holding operation.

At time t2, P7 is changed to L level, and the current supply to M1 is stopped, and M4 is turned ON, and the drain current of M1 which was set by the M1/G voltage is injected to the corresponding EL device, and in response to this, the corresponding EL device starts the light emission which was set again before time t1, and continues this until it is set again.

Also in the EL panel with the current setting system, the horizontal scanning shift register 3 and the vertical scanning shift register 5 are being used, and the number of DFFs which are used as registers in respective shift registers equals to the number of horizontal pixels and the number of vertical pixels of a display panel.

In the EL panel with the voltage setting system and the EL panel with the current setting system which were described above, the shift register of this invention is desirably applicable thereto as the horizontal scanning shift register 3 and the vertical scanning shift register 5, but, in particular, if it is used as the horizontal scanning shift register 3 which requires many pulses during one scanning period, a power saving effect of this invention appears significantly.

In order to show greatness of the power saving effect of the shift register of this invention, approximate calculation of power consumption at the time of maximum brightness of a two inch EL panel of QVGA (320×240) is tried.

The EL panel is a display panel of a self-luminous type, and is a promising display panel in which a thin type, a wide viewing angle, and low power consumption are expected. Electric power Pw4 which is required for light emission is obtained by an equation (7) with the use of the number of horizontal pixels Nh of the display panel, the number of vertical pixels Nv, light emission current Io per pixel and the power supply voltage VCC of the TFT circuit.

$$Pw4 = VCC \times Io \times Nh \times Nv \tag{7}$$

The light emission current Io is basically in proportion to pixel area and light emission energy, and in case of a color panel, it is conceivable that a division ratio of the light emission current Io differs with respect to each color of RGB.

Here, It is possible to estimate that the light emission current Io per pixel is approximately 300 nA assuming that maximum light emission energy is 300 cd/m² in case of the two inch EL panel of QVGA(320×240). In this case, the following result is obtained.

$$Pw4 = 10 \times 300 \times 320 \times 240 \; nW = 230 \; mW$$

In particular, in order to reduce power consumption of the EL panel, it is strongly desired to reduce reactive power other than light emission power shown by the equation (7). Power consumption in the conventional shift register is Pw1=48.1 mW as described in the above-described related art in case of use in the same display panel of QVGA type. Therefore, it is found that the reactive power of approximately 21% at the time of maximum brightness was consumed only in the horizontal shift register, and it is found that an effect of reducing the power consumption by use of the shift register of this invention is remarkable.

FIG. 22 is a view for explaining an information display apparatus which used the EL panel described in the above embodiments as a display device. This information display apparatus takes each form of a portable telephone, a portable computer, a still camera or a video camera. Or, it is an apparatus which realizes a plurality of functions out of their functions. What corresponds to the EL panel which has been described in the above-described embodiments is a display apparatus 2201. A reference numeral 2202 designates an information input part. In case of a portable telephone, the information input part is configured so as to include an antenna, and for example, in case of PDA and a portable personal computer, the information input part is configured so as to include an interface part to a network, and in case of a still camera and a movie camera, the information input part is configured so as to include a sensor part by use of CCD, CMOS and the like. A reference numeral 2203 designates a housing which holds the information input part 2202 and the display apparatus 2201.

As described above, a shift register which used this invention is one which can realize reduction of power consumption while suppressing considerable increase of the number of wiring, and reliable operations.

What is claimed is:

1. A shift register comprising:
   a plurality of pulse generation portions for generating a series of pulse signals in response to a level change of inputted clock signals, the plurality of pulse generation portions including a predetermined pulse generation portion which outputs a pulse signal out of the series of pulse signals, an earlier pulse generation portion which outputs a pulse signal out of the series of pulse signals earlier than the predetermined pulse generation portion, and a later pulse generation portion which outputs a pulse signal out of the series of pulse signals later than the predetermined pulse generation portion;
   a first clock supply circuit for supplying the clock signal to the predetermined pulse generation portion;

a second clock supply circuit for supplying the clock signal to the earlier pulse generation portion;
a third clock supply circuit for supplying the clock signal to the later pulse generation portion; and
a status signal generation circuit for outputting a status signal to both of the second clock supply circuit and the third clock supply circuit via a common output portion, the status signal showing a status that the predetermined pulse generation portion generated a pulse signal out of the series of pulse signals.

2. A shift register according to claim 1, wherein the second clock supply circuit controls supplying the clock signal to the earlier pulse generation portion based on the status signal, and the third clock supply circuit controls supplying the clock signal to the later pulse generation portion based on the status signal.

3. A shift register according to claim 1, wherein the second clock supply circuit is controlled to stop supplying the clock signal to the earlier pulse generation portion upon receiving the status signal.

4. A shift register according to claim 1, wherein the third clock supply circuit is controlled to start supplying the clock signal to the later pulse generation portion upon receiving the status signal.

5. A display apparatus having the shift register as set forth in claim 1 and a plurality of display elements.

6. A shift register comprising:
a plurality of pulse generation portions for generating a series of pulse signals in response to a level change of inputted clock signals, the plurality of pulse generation portions including a predetermined pulse generation portion which outputs a pulse signal out of the series of pulse signals, an earlier pulse generation portion which outputs a pulse signal out of the series of pulse signals earlier than the predetermined pulse generation portion, and a later pulse generation portion which outputs a pulse signal out of the series of pulse signals later than the predetermined pulse generation portion;
a first clock supply circuit for supplying the clock signal to the predetermined pulse generation portion;
a second clock supply circuit for supplying the clock signal to the earlier pulse generation portion;
a third clock supply circuit for supplying the clock signal to the later pulse generation portion; and
a status signal generation circuit for outputting a status signal having a pulse width wider than a pulse width of the pulse signal, the status signal showing a status that the predetermined pulse generation portion generated a pulse signal out of the series of pulse signals.

7. A shift register according to claim 6, wherein the second clock supply circuit controls supplying the clock signal to the earlier pulse generation portion based on the status signal and the third clock supply circuit controls supplying the clock signal to the later pulse generation based on the status signal.

8. A shift register according to claim 6, wherein the second clock supply circuit is controlled to stop supplying the clock signal to the earlier pulse generation portion upon receiving the status signal.

9. A shift register according to claim 6, wherein the third clock supply circuit is controlled to start supplying the clock signal to the later pulse generation portion upon receiving the status signal.

10. A shift register according to claim 6, wherein the status signal generation circuit outputs the status signal to both of the second clock supply circuit and the third clock supply circuit via a common output portion.

11. A display apparatus having the shift register as set forth in claim 6 and a plurality of display elements.

* * * * *

UNITED STATES PATENT AND TRADEMARK OFFICE
CERTIFICATE OF CORRECTION

PATENT NO. : 7,031,422 B2
APPLICATION NO. : 11/051187
DATED : April 18, 2006
INVENTOR(S) : Somei Kawasaki et al.

It is certified that error appears in the above-identified patent and that said Letters Patent is hereby corrected as shown below:

On Title Page
ASSIGNEE:

Please insert the following:

Item
--(73) Assignee: Canon Kabushiki Kaisha, Tokyo (JP)--.

On Title Page
INVENTORS:

Item
"(76) Inventors: Somei Kawasaki, Canon Kabushiki Kaisha, 3-30-2, Shimomaruko, Ohta-ku, Tokyo (JP); Masami Iseki, Canon Kabushiki Kaisha, 3-30-2, Shimomaruko, Ohta-ku, Tokyo (JP)" should read --(75) Inventors: Somei Kawasaki, Saitama (JP); Masami Iseki, Kanagawa (JP)--.

After "Primary Examiner" - Margaret R. Wambach", insert the following:

--(74) Attorney, Agent, of Firm - Fitzpatrick, Cella, Harper & Scinto--.

COLUMN 2:

Line 26, "of a" should read --to a--.
Line 45, "10 v," should read --10V,--.

COLUMN 8:

Line 52, "DEF" should read --DFF--.

COLUMN 13:

Line 50, "v," should read --V,--.

COLUMN 21:

Line 38, "VCC=10 v," should read --VCC=10V,--.

UNITED STATES PATENT AND TRADEMARK OFFICE
CERTIFICATE OF CORRECTION

PATENT NO. : 7,031,422 B2
APPLICATION NO. : 11/051187
DATED : April 18, 2006
INVENTOR(S) : Somei Kawasaki et al.

It is certified that error appears in the above-identified patent and that said Letters Patent is hereby corrected as shown below:

COLUMN 26:

Line 49, "to," should read --t0,--.

COLUMN 27:

Line 16, "to," should read --t0--.

Signed and Sealed this

Nineteenth Day of December, 2006

JON W. DUDAS
*Director of the United States Patent and Trademark Office*